US012598776B2

(12) United States Patent
Frougier et al.

(10) Patent No.: US 12,598,776 B2
(45) Date of Patent: Apr. 7, 2026

(54) NANOSHEET EPITAXY WITH FULL BOTTOM ISOLATION

(71) Applicant: INTERNATIONAL BUSINESS MACHINES CORPORATION, Armonk, NY (US)

(72) Inventors: Julien Frougier, Albany, NY (US); Andrew M. Greene, Slingerlands, NY (US); Ruilong Xie, Niskayuna, NY (US); Lan Yu, Voorheesville, NY (US); Pietro Montanini, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 975 days.

(21) Appl. No.: 17/457,448

(22) Filed: Dec. 3, 2021

(65) Prior Publication Data

US 2023/0178617 A1     Jun. 8, 2023

(51) Int. Cl.
H10D 30/67        (2025.01)
H10D 62/10        (2025.01)
(Continued)

(52) U.S. Cl.
CPC ..... H10D 30/6735 (2025.01); H10D 30/6757 (2025.01); H10D 62/118 (2025.01); (Continued)

(58) Field of Classification Search
CPC .................................................. H10D 30/6735
See application file for complete search history.

(56) References Cited

U.S. PATENT DOCUMENTS 9,431,512 B2 *   8/2016   Koh ................... H10D 30/6735
9,947,804 B1     4/2018   Frougier
(Continued)

FOREIGN PATENT DOCUMENTS

AU     2007222162 B2     3/2013
CN     108156828 A       6/2018
(Continued)

OTHER PUBLICATIONS

Disclosed Anonymously, "Method for Bottom Air Gap Isolation for Nano-Sheet Structures", An IP.com Prior Art Database Technical Disclosure, IP.com No. IPCOM000258090D, IP.com Electronic Publication Date: Apr. 8, 2019, 7 pages.
(Continued)

*Primary Examiner* — William A Harriston
(74) *Attorney, Agent, or Firm* — Kristofer Haggerty

(57)          ABSTRACT
Semiconductor channel layers vertically aligned and stacked one on top of another, separated by a gate stack material wrapping around the semiconductor channel layers, a heavily doped p-type field effect transistor (p-FET) source drain epitaxy region adjacent to the semiconductor channel layers, a horizontal lower surface of the p-FET source drain epitaxy region is adjacent to a horizontal upper surface of an undoped silicon epitaxy. Forming a first stack, second stack and third stack of nanosheet layers on a substrate, each including alternating layers of a sacrificial and a semiconductor channel vertically aligned and stacked one on top of another, forming a first sacrificial gate across the first stack, a second sacrificial gate across the second stack and a third sacrificial gate across the third stack, forming an undoped silicon epitaxy between the first and the second stacks and between the second and the third stacks.

20 Claims, 37 Drawing Sheets

Section X2-X2

(51) Int. Cl.

| | | |
|---|---|---|
| *H10D 64/23* | (2025.01) | |
| *H10D 84/01* | (2026.01) | |
| *H10D 84/03* | (2025.01) | |
| *H10D 84/85* | (2025.01) | |

(52) U.S. Cl.

CPC ....... *H10D 64/258* (2025.01); *H10D 84/0167* (2025.01); *H10D 84/0188* (2025.01); *H10D 84/038* (2025.01); *H10D 84/85* (2025.01)

(56) References Cited

U.S. PATENT DOCUMENTS

| | | | |
|---|---|---|---|
| 9,984,936 B1 * | 5/2018 | Xie | H10D 30/6757 |
| 10,032,867 B1 | 7/2018 | Yeung | |
| 10,332,803 B1 | 6/2019 | Xie | |
| 10,388,727 B2 | 8/2019 | Ando | |
| 10,461,154 B1 | 10/2019 | Song | |
| 10,930,734 B2 | 2/2021 | Bao | |
| 10,937,860 B2 | 3/2021 | Bi | |
| 2012/0141799 A1 | 6/2012 | Kub | |
| 2015/0372111 A1 * | 12/2015 | Koh | H10D 30/43 |
| | | | 257/29 |
| 2018/0006113 A1 * | 1/2018 | Cheng | H01L 21/02532 |
| 2018/0006139 A1 * | 1/2018 | Seo | H01L 21/3065 |
| 2018/0047853 A1 * | 2/2018 | Chang | H01L 21/2255 |
| 2019/0237541 A1 * | 8/2019 | Chang | H10D 30/63 |
| 2019/0287864 A1 | 9/2019 | Cheng | |
| 2020/0365687 A1 | 11/2020 | Xie | |
| 2021/0193797 A1 | 6/2021 | Xie | |
| 2023/0178617 A1 * | 6/2023 | Frougier | H10D 62/121 |
| | | | 257/369 |

FOREIGN PATENT DOCUMENTS

| | | |
|---|---|---|
| JP | 5586233 B2 | 9/2014 |
| KR | 101374090 B1 | 3/2014 |
| WO | 2023/099305 A1 | 6/2023 |

OTHER PUBLICATIONS

Disclosed Anonymously, "Method for Providing a STI Top-Off Scheme to Separate Gate from Substrate on Nanosheet Structures", An IP.com Prior Art Database Technical Disclosure, IP.com No. IPCOM000259612D, IP.com Electronic Publication Date: Aug. 27, 2019, 6 pages.

Yoon et al., "Punch-Through-Stopper Free Nanosheet FETs With Crescent Inner-Spacer and Isolated Source/Drain" IEEE Access, vol. 7, 2019, pp. 38593-38596.

Notification of Transmittal of the International Search Report and the Written Opinion of the International Searching Authority, or the Declaration, Date of Mailing Feb. 22, 2023, Applicant's or agent's file reference P201907131, International application No. PCT/EP2022/082962, 15 pages.

* cited by examiner

Section X2-X2

Section X1-X1

Section Y-Y

Section X1-X1

Section X2-X2

Section Y-Y

Section X2-X2

Section X1-X1

Section Y-Y

Section X2-X2

Section X1-X1

Section Y-Y

Section X2-X2

Section X1-X1

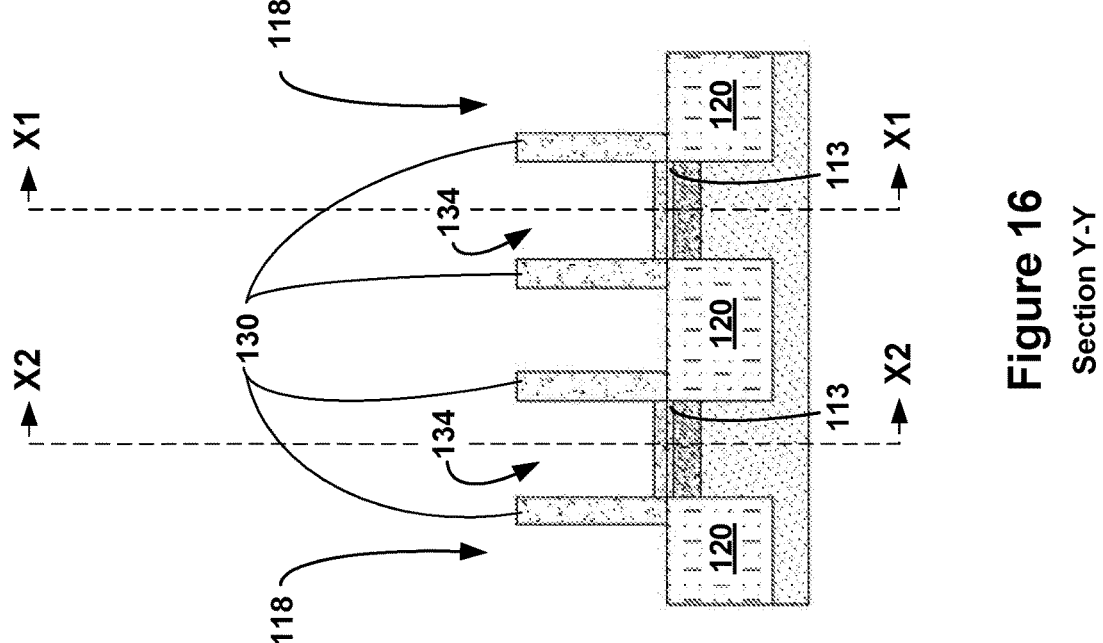
Figure 16
Section Y-Y
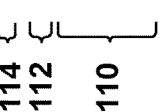

Section X1-X1

Section X2-X2

Section Y-Y

Section X2-X2

Section X1-X1

Section Y-Y

Section X2-X2

Section X1-X1

100

110

Section Y-Y

Section X2-X2

Section X1-X1

Section Y-Y

Section X2-X2

Section X1-X1

Section Y-Y

Section X2-X2

Section X1-X1

Section Y-Y

Section X2-X2

Section X1-X1

Section Y-Y

Section X2-X2

Section X1-X1

Section Y-Y

Section X2-X2

Section X1-X1

Section Y-Y

Section X2-X2

Section X1-X1

Section Y-Y

Section X1-X1

Section X2-X2

Section Y-Y

Section X2-X2

Section X1-X1

Section Y-Y

Section X2-X2

Section X1-X1

Section Y-Y

NANOSHEET EPITAXY WITH FULL BOTTOM ISOLATION

BACKGROUND

The present invention relates, generally, to the field of semiconductor manufacturing, and more particularly to fabricating a gate-all-around nanosheet field effect transistor with improved nanosheet epitaxy and full bottom isolation.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of nanosheets extending between a pair of source drain epitaxial regions. The device may be a gate all around transistor in which a gate surrounds at least a portion of the nanosheet channel.

Bottom dielectric isolation of source and drain epitaxy from the substrate is required for optimal electrical performance as gate lengths approach 12 nanometer and below.

SUMMARY

According to an embodiment, a gate-all-around device is provided. The gate-all-around device including semiconductor channel layers vertically aligned and stacked one on top of another, the semiconductor channel layers separated from each other by a gate stack material wrapping around the semiconductor channel layers, and a heavily doped p-type field effect transistor (p-FET) source drain epitaxy region adjacent to the semiconductor channel layers, where a horizontal lower surface of the p-FET source drain epitaxy region is adjacent to a horizontal upper surface of an undoped silicon epitaxy.

According to an embodiment, a semiconductor device is provided. The semiconductor device including a first set of semiconductor channel layers vertically aligned and stacked one on top of another, a heavily doped p-type field effect transistor (p-FET) source drain epitaxy region adjacent to the first set of semiconductor channel layers, where a horizontal lower surface of the p-FET source drain epitaxy region is adjacent to a horizontal upper surface of an undoped silicon epitaxy, and a heavily doped n-type field effect transistor (n-FET) source drain epitaxy doped region adjacent to a second set of semiconductor channel layers, where a horizontal lower surface of the n-FET source-drain epitaxy region is adjacent to the horizontal upper surface of the undoped silicon epitaxy.

According to an embodiment, a method is provided. The method including forming a first stack of nanosheet layers on a substrate, a second stack of nanosheet layers on the substrate, and a third stack of nanosheet layers on the substrate, the first stack, the second stack and the third stack of nanosheet layers each including alternating layers of a sacrificial and a semiconductor channel vertically aligned and stacked one on top of another, forming a first sacrificial gate across the first stack of nanosheet layers, a second sacrificial gate across the second stack of nanosheet layers and a third sacrificial gate across the third stack of nanosheet layers, and forming an undoped silicon epitaxy between the first stack and the second stack of nanosheet layers and between the second stack and the third stack of nanosheet layers.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 2 and 3 are parallel to each other, and FIG. 4 is perpendicular to FIGS. 2 and 3, according to an exemplary embodiment;

FIGS. 14, 15 and 16 each illustrate a cross-sectional view of the of the semiconductor structure along section lines X1-X1, X2-X2 and Y-Y, respectively, and illustrates formation of inner spacers;

Figure 1:
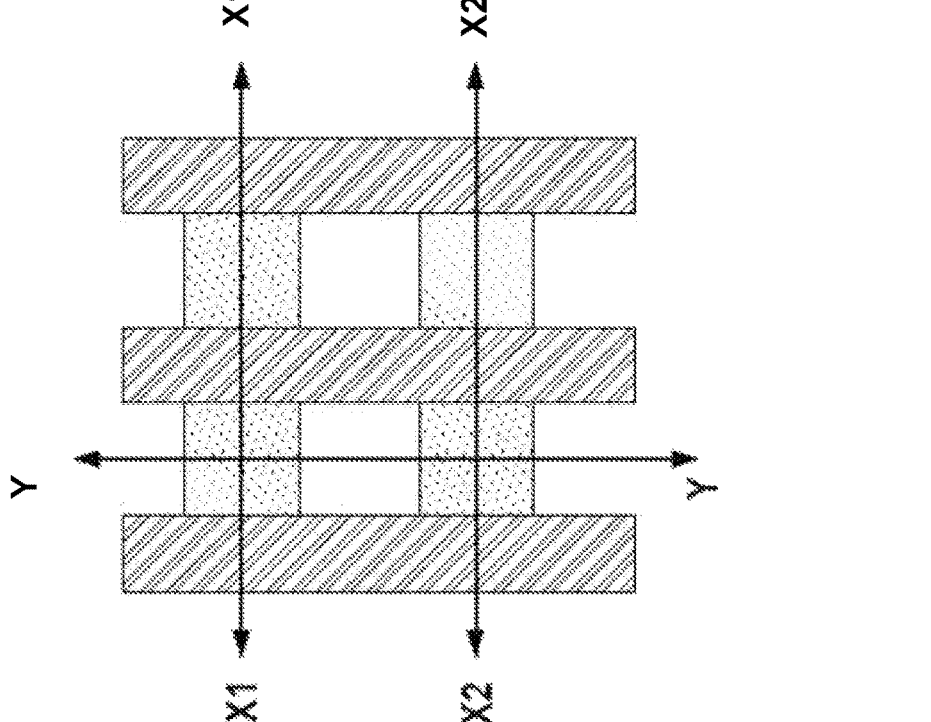
FIG. 1 illustrates a top view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon, referred to as channel layers, and silicon germanium, referred to as sacrificial suspension layers, which are then formed into nanosheets. A gate all around structure may be formed on all vertical sides and on a horizontal top surface of a section of the nanosheets. Source-drain epitaxy structures may be formed at the opposite ends of the nanosheet structures.

The present invention relates, generally, to the field of semiconductor manufacturing, and more particularly to fabricating a nanosheet field effect transistor with full bottom isolation.

For nanosheet FET devices on a bulk substrate, source drain epitaxy grows from sides of the silicon channel layers of the nanosheet devices and also from the substrate. This may lead to parasitic source-to-drain leakage through the sub-sheet region under the gate region of the nanosheet FET device, which has a negative effect on nanosheet FET performance such as increased parasitic leakage.

To reduce parasitic source-to-drain leakage between the source and drain epitaxy contact through the substrate, a bottom dielectric isolation (BDI) which isolates the source-drain epitaxy from the substrate is required for optimal electrical performances, especially at effective gate stack lengths of 12 nm and below. The effective gate stack length is defined as the physical distance of the gate stack in the direction of current transport (not accounting for the thickness of the gate dielectric). For example, a gate length of 15 nm may have an effective gate length of 12 nm.

This results in the source drain epitaxy growing only from the channel layers without a benefit of also growing from the substrate and makes it difficult to generate strain on the channel regions, or channel layers of the nanosheet.

Typically, stress can be generated in the source drain epitaxy by having a bottom-up nucleation and growth component from the substrate. However, the addition of a BDI layer may remove this bottom-up nucleation and growth component leading to a fully relaxed source-drain epitaxy, thereby reducing device performance. Here, the inventors propose a new method of introducing stress to the source drain epitaxy while using a BDI layer.

Stress on the semiconductor channel layer improves performance of the nanosheet FET by generating strain in the channel, improving carrier mobility in the channel and thereby increasing device performance. Strain engineering allows local modification of the band structure in the channel region, affecting the effective mass of the carriers and hence the carrier mobility during transport in the channel region.

In an embodiment of this invention an undoped silicon epitaxy is formed between stacked nanosheets, a bottom dielectric isolation is formed between the stacked nanosheets, the undoped silicon epitaxy and the substrate. A portion of the undoped silicon epitaxy is removed, and a remaining portions of the undoped silicon epitaxy along with channel regions of the stacked nanosheets are used to grown the source drain epitaxy.

In an embodiment of this invention, a stacked nanosheet of alternating layers of sacrificial semiconductor material and semiconductor channel material is formed on a substrate over a nanosheet sacrificial layer. The stacked nanosheet is formed into nanosheet stacks and a shallow trench isolation formed between each nanosheet stack. A sacrificial gate and gate hard mask is formed, in a direction perpendicular to the nanosheet stacks. A spacer is formed on opposite sides of the sacrificial gate and gate hard mask, and on opposite sides of the nanosheet stack between sacrificial gates. A source drain trench is formed between adjacent sacrificial gate, gate hard mask and spacers. The source drain trench is formed by removal of vertically aligned portions of the nanosheet stack. In a process of record, the source drain trench may expose the nanosheet sacrificial layer. In this process, as a new feature, portions of the nanosheet stack remain below the source drain trench, where the nanosheet sacrificial layer, a lowermost channel layer and at least a portion of a lowermost sacrificial semiconductor material layer are not removed, and remain between sacrificial gates. A portion of each of the sacrificial suspension layers may be indented, and an inner spacer may be formed on either side of the sacrificial suspension layers. An undoped silicon epitaxy may be formed between nanosheet stacks, and between the spacers. The undoped silicon epitaxy is a new feature. A portion of the shallow trench isolation may be removed, exposing the sacrificial epitaxial layer. The sacrificial epitaxial layer may be removed. A bottom dielectric isolation may be formed where the sacrificial epitaxial layer was removed. This is a unique feature, where the bottom dielectric isolation is under the undoped silicon epitaxy. An etch stop liner may be formed. A first organic planarization layer may be formed and patterned on a portion of the structure. A portion of the etch stop liner and a portion of the undoped epitaxy may be removed where not covered by the first organic planarization layer. A p-FET source drain epitaxy may be formed between sacrificial gates which are not protected by the first organic planarization layer. The first organic planarization layer and remaining etch stop liner may be removed and the process steps repeated to form an n-FET source drain epitaxy in between sacrificial gates which were originally protected by the first organic planarization layer. Both the p-FET source drain epitaxy and the n-FET source drain epitaxy may be grown from both the undoped silicon epitaxy and from the channel layers. An interlayer dielectric may be formed between adjacent sacrificial gates, gate hard mask and spacers. The gate hard mask, the sacrificial gate, and the sacrificial suspension layers may be removed. Selective etching may be performed. A gate stack may be formed where the gate hard mask, the sacrificial gate, and the sacrificial suspension layers were removed. An alternate embodiment results in the p-FET source drain epitaxy directly contacting a second bottom dielectric isolation.

Embodiments of the present invention disclose a structure and a method of forming a gate-all-around nanosheet with source drain epitaxy formed from undoped silicon epitaxy and from channel regions of a stacked nanosheet, and are described in detail below by referring to the accompanying drawings, in accordance with an illustrative embodiment.

Referring now to FIG. 1, a semiconductor structure 100 (hereinafter "structure") at an intermediate stage of fabrication is shown according to an exemplary embodiment. FIG. 1 is a top view of the structure 100 at an intermediate stage of fabrication. The structure 100 of FIG. 1 may be formed or provided.

Section line Y-Y of FIG. 1 is parallel with subsequently formed gate lines and is centered between adjacent gates in a source drain epitaxy region. Section line X1-X1 and section line X2-X2 of FIG. 1 are parallel to each other, are an intersecting line along a length of fins or nanosheet stacks of the structure 100 and are each perpendicular to section line Y-Y.

Figures 2, 3:
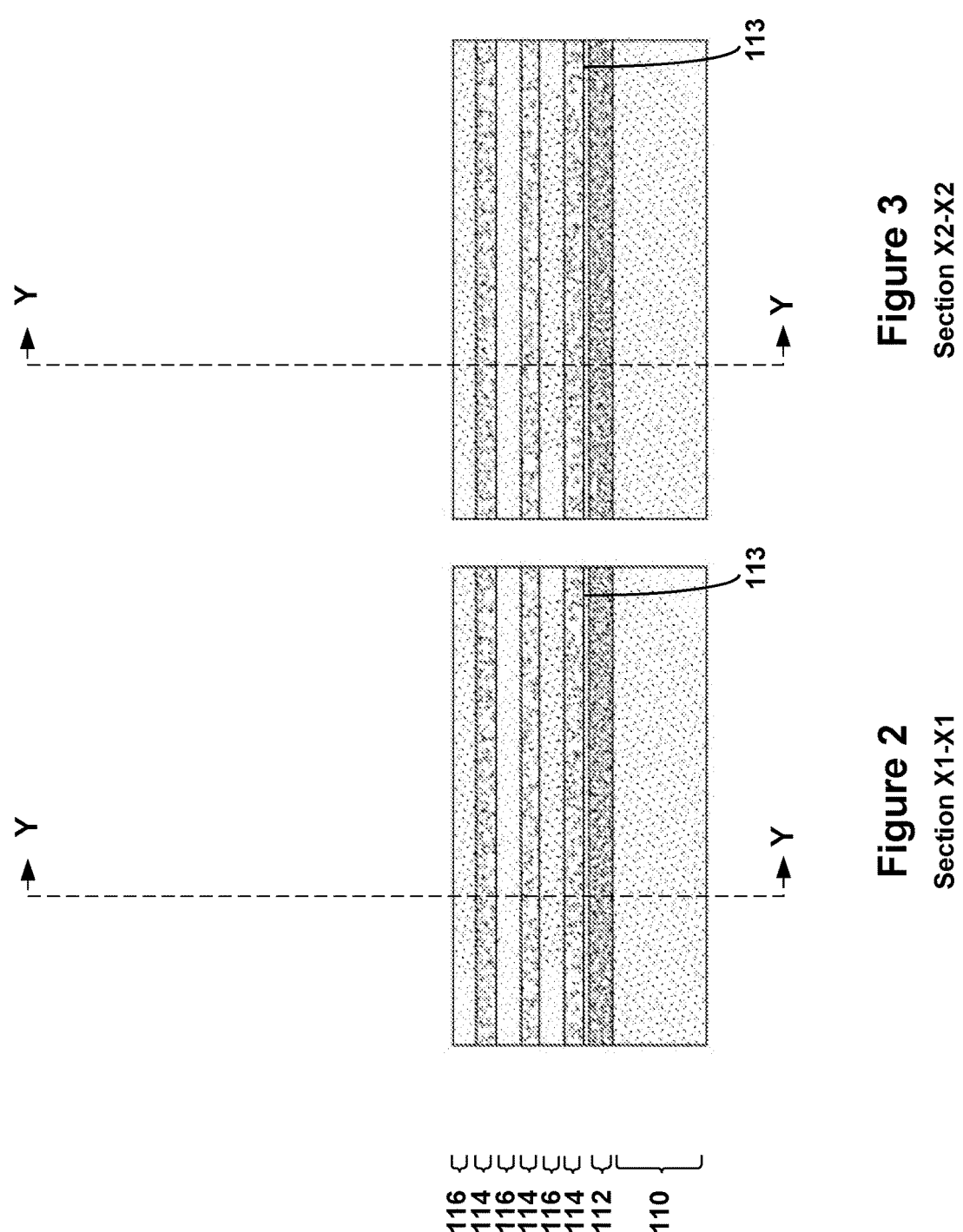
FIGS. 2, 3 and 4 each illustrate a cross-sectional view of the semiconductor structure of FIG. 1 along section lines X1-X1, X2-X2 and Y-Y, respectively.
Figure 4:
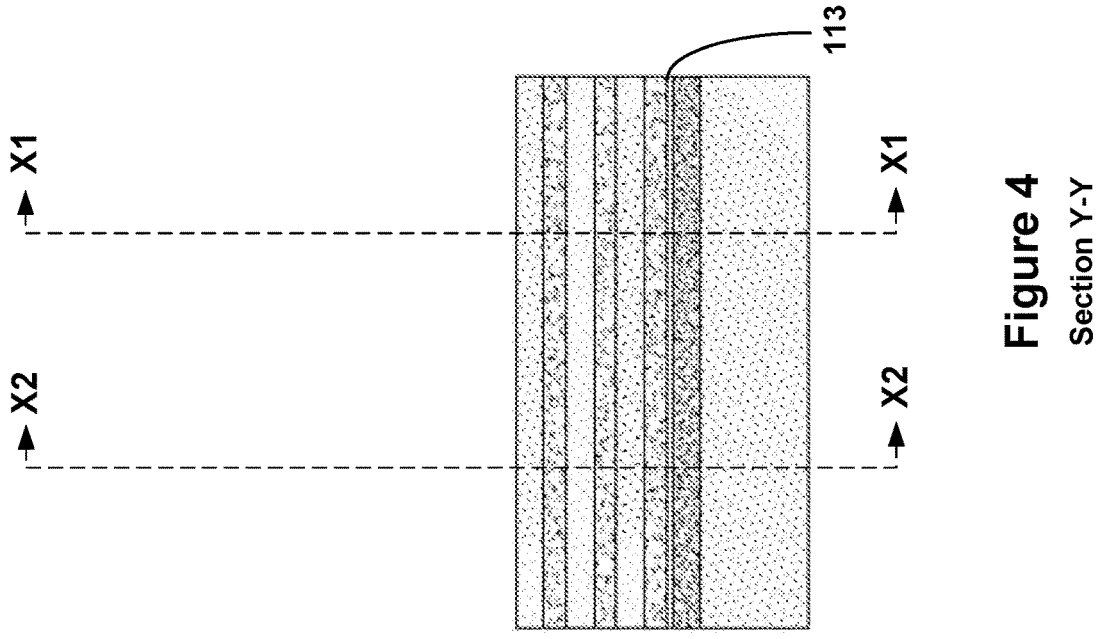
Figure 4:
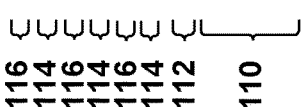

Referring now to FIGS. 2, 3 and 4, the structure 100 is shown according to an exemplary embodiment. FIGS. 2 and 3 are each a cross-sectional view of the structure 100 along section lines X1-X1 and X2-X2, respectively, and are parallel to each other. FIG. 4 is a cross-sectional view of the structure 100 along section line Y-Y and is perpendicular to section lines X1-X1 and X2-X2.

The structure 100 may include a substrate 110. The substrate 110 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 110 may be approximately, but is not limited to, several hundred microns thick. In other embodiments, the substrate 110 may be a layered semiconductor such as a silicon-on-insulator or SiGe-on-insulator, where a buried insulator layer, separates a base substrate from a top semiconductor layer.

A stacked nanosheet of alternating layers of sacrificial semiconductor material and semiconductor channel material stacked one on top of another, may be formed on the substrate 110. It should be noted that, while a limited number of alternating layers are depicted, any number of alternating layers may be formed.

The alternating layers of sacrificial semiconductor material and semiconductor channel material may include a nanosheet sacrificial epitaxial layer 112 (hereinafter "sacrificial epitaxial layer") on the substrate 110, covered by a semiconductor seed material layer 113 (hereinafter "seed layer"), covered by a sacrificial suspension semiconductor material layer 114 (hereinafter "sacrificial suspension layer"), covered by a semiconductor channel material layer 116 (hereinafter "channel layer"), covered by a sacrificial suspension layer 114, covered by a channel layer 116, covered by a sacrificial suspension layer 114, covered by a channel layer 116.

The sacrificial epitaxial layer 112, may, for example, be silicon germanium with a germanium concentration between 45 and 70 atomic percent, although percentages greater than 70 percent and less than 45 percent may be used. The sacrificial epitaxial layer 112 can be formed using known deposition techniques or an epitaxial growth technique as described below. The sacrificial epitaxial layer 112 will subsequently be removed selective to the remaining alternating layers, as described below.

Each sacrificial suspension layer 114 is composed of a first semiconductor material which differs in composition from at least an upper portion of the substrate 110, the channel layers 116 and the sacrificial epitaxial layer 112. In an embodiment, each sacrificial suspension layer 114 may be a silicon-germanium semiconductor alloy and have a germanium concentration less than 50 atomic percent. In another example, each sacrificial suspension layer 114 may have a germanium concentration ranging from about 15 atomic percent to about 35 atomic percent, although percentages greater than 35 percent and less than 15 percent may be used. Each sacrificial suspension layer 114 can be formed using known deposition techniques or an epitaxial growth technique as described below.

Each channel layer 116 is composed of a second semiconductor material which differs in composition from at least the upper portion of the substrate 110, the sacrificial suspension layers 114 and the sacrificial epitaxial layer 112. Each channel layer 116 has a different etch rate than the first semiconductor material of sacrificial suspension layer 114 and has a different etch rate than the sacrificial epitaxial layer 112. The sacrificial suspension layer 114 has a different etch rate than the sacrificial epitaxial layer 112. The second semiconductor material can be, for example, silicon. The second semiconductor material, for each channel layer 116, can be formed using known deposition techniques or an epitaxial growth technique as described above.

In an embodiment, the seed layer 113 may be composed of the second semiconductor material.

In an embodiment, the sacrificial epitaxial layer 112 may be the same material as the sacrificial suspension layer 114, and would have the same etch rate as each other.

The sacrificial epitaxial layer 112, the seed layer and the alternating layers of sacrificial suspension layers 114 and the channel layers 116 can be formed by sequential epitaxial growth of the sacrificial epitaxial layer material and alternating layers of the first semiconductor material and the second semiconductor material.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth of first and second semiconductor materials that provide the sacrificial epitaxial layer 112 , the sacrificial suspension layers 114 and the channel layers 116, respectively, can be performed utilizing any well-known precursor gas or gas mixture. Carrier gases like hydrogen, nitrogen, helium and argon can be used.

The sacrificial epitaxial layer 112 may have a thickness ranging from about 5 nm to about 15 nm. The seed layer 113 may have a thickness ranging from about 2 nm to about 5 nm. The sacrificial suspension layers 114 may each have a thickness ranging from about 5 nm to about 12 nm, while the channel layers 116 may each have a thickness ranging from about 5 nm to about 12 nm. Each sacrificial suspension layer 114 may have a thickness that is the same as, or different from, a thickness of each channel layer 116. In an embodiment, each sacrificial suspension layer 114 has an identical thickness. In an embodiment, each channel layer 116 has an identical thickness.

Figures 5, 6:
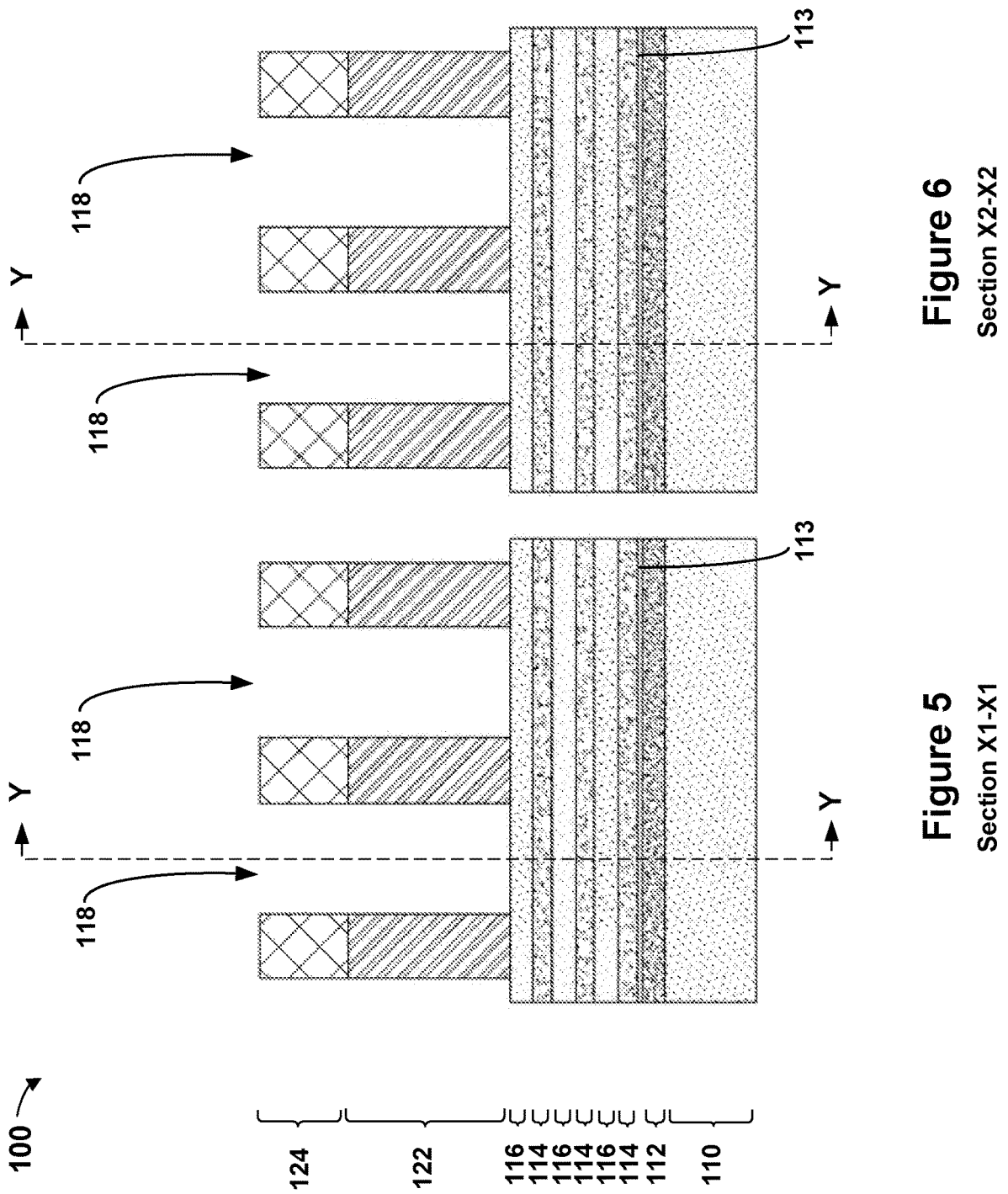
FIGS. 5, 6 and 7 each illustrate a cross-sectional view of the of the semiconductor structure along section lines X1-X1, X2-X2 and Y-Y, respectively, and illustrates formation of nanosheet stacks, shallow trench isolation and sacrificial gates, according to an exemplary embodiment.
Figure 7:
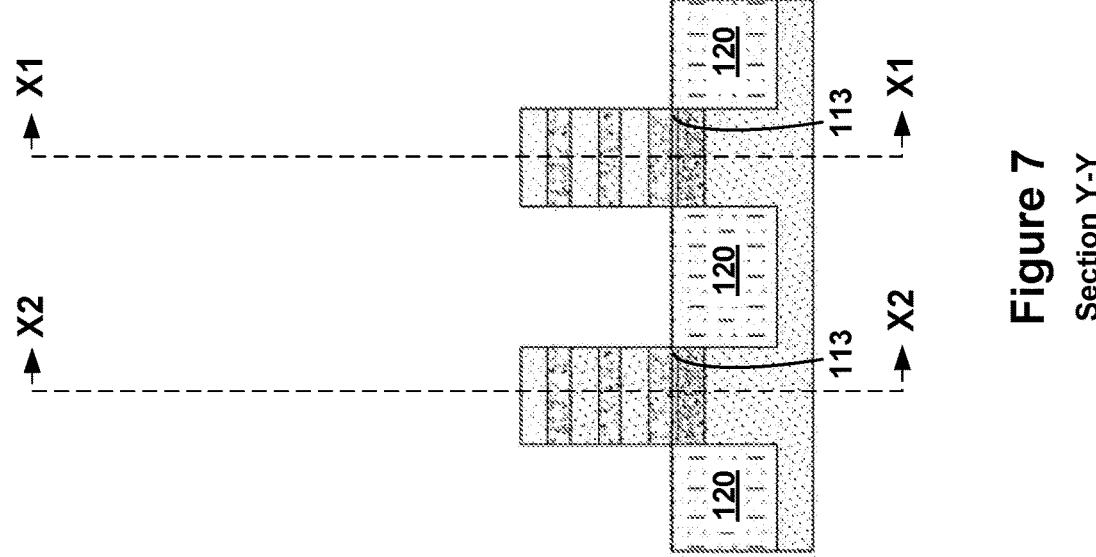
Figure 7:
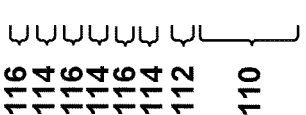

Referring now to FIGS. 5, 6 and 7, the structure 100 is shown according to an exemplary embodiment. FIGS. 5 and 6 are each a cross-sectional view of the structure 100 along section lines X1-X1 and X2-X2, respectively, and are parallel to each other. FIG. 7 is a cross-sectional view of the structure 100 along section line Y-Y and is perpendicular to section lines X1-X1 and X2-X2. The stacked nanosheet may be formed into nanosheet stacks. A shallow trench isolation region (hereinafter "STI") 120 may be formed between each nanosheet stack. A sacrificial gate 122 and a gate hard mask 124 may be formed.

As shown in FIG. 7, the stacked nanosheet may be formed into nanosheet stacks. The nanosheet stacks may have a length perpendicular to section line Y-Y and parallel to section lines X1-X1 and X2-X2. The nanosheet stacks may be formed by methods known in the arts, and include steps such as forming a nanosheet hard mask (not shown) on the stacked nanosheet, patterning the nanosheet hard mask (not shown) and subsequent formation of one or more trenches 118, by removal of portions of each layer of the stacked nanosheet. The trench 118 may be formed between each nanosheet stack by an anisotropic etching technique, such as, for example, reactive ion etching (RIE), and stopping on etching a portion of the substrate 110 for subsequent formation of the STI 120 between each nanosheet stack. The nanosheet hard mask (not shown) may be removed.

Each nanosheet stack may include the sacrificial epitaxial layer 112 covered by the seed layer 113, covered by the alternating layers of channel layers 116 and sacrificial suspension layers 114. In this embodiment, and only by way of an example, the nanosheet stack includes three layers of channel layers 116 alternating with three layers of the sacrificial suspension layers 114. The material stacks that can be employed in embodiments of the present invention are not limited to the specific embodiment illustrated in the Figures. There may be any number of nanosheet stacks on the structure 100.

The nanosheet stack is used to produce a gate all around device that includes vertically stacked semiconductor channel material nanosheets for a p-FET or an n-FET device.

The STI 120 is formed in a portion of the trench 118. The STI 120 may be formed between adjacent nanosheet stacks in the portion of the trench 118, between adjacent nanosheet stacks. The STI 120 may be a dielectric material and may be between adjacent nanosheet stacks and formed using known deposition, planarization and etching techniques. Adjacent nanosheet stacks are isolated from one another in the substrate 110 by the STI 120. A lower horizontal surface and a portion of a vertical side surface of the STI 120 may be adjacent to a lower horizontal surface and a vertical side surface of the substrate 110. The lower horizontal surface of the STI 120 may be below a lower horizontal surface of the stack sacrificial layer 112. An upper horizontal surface of the STI 120 may be at a same level or higher than an upper horizontal surface of the seed layer 113.

The sacrificial gate 122 may include a single sacrificial material or a stack of one or more sacrificial materials. The at least one sacrificial material can be formed by forming a blanket layer (or layers) of a material (or various materials) and then patterning the material (or various materials) by lithography and an etch. The sacrificial gate 122 can include any material including, for example, polysilicon, amorphous silicon, or multilayered combinations thereof. The sacrificial gate 122 can be formed using any deposition technique including, for example, chemical vapor deposition (CVD), physical vapor deposition (PVD), high density plasma (HDP) deposition, and spin on techniques. Optionally, the gate hard mask 124 may be formed as part of the sacrificial gate 122 in accordance with known techniques. As shown in FIGS. 5 and 6, there are two sacrificial gates 122. In an embodiment, there may be any number of sacrificial gates 122 formed.

In an embodiment, the sacrificial gate 122 is deposited with a thickness sufficient to fill, or substantially fill, the spaces between adjacent nanosheet stacks (not shown) and cover an upper surface and exposed side surfaces of an upper surface of the uppermost sacrificial channel layer 116 of the nanosheet stack. The sacrificial gate 122 may be adjacent to vertical side surfaces of the nanosheet stack, including vertical side surfaces of the sacrificial epitaxial layer 112, the channel layers 116 and the sacrificial suspension layers 114. A height of the sacrificial gate 122 may be much thicker than the underlying structure and may have a height between 50 nm and 100 nm above the nanosheet stack.

The gate hard mask 124 may be formed over a horizontal upper surface of the sacrificial gate 122, by methods known in the art. The gate hard mask 124 may have vertical side surfaces which align with vertical side surfaces of the sacrificial gate 122.

Figures 8, 9:
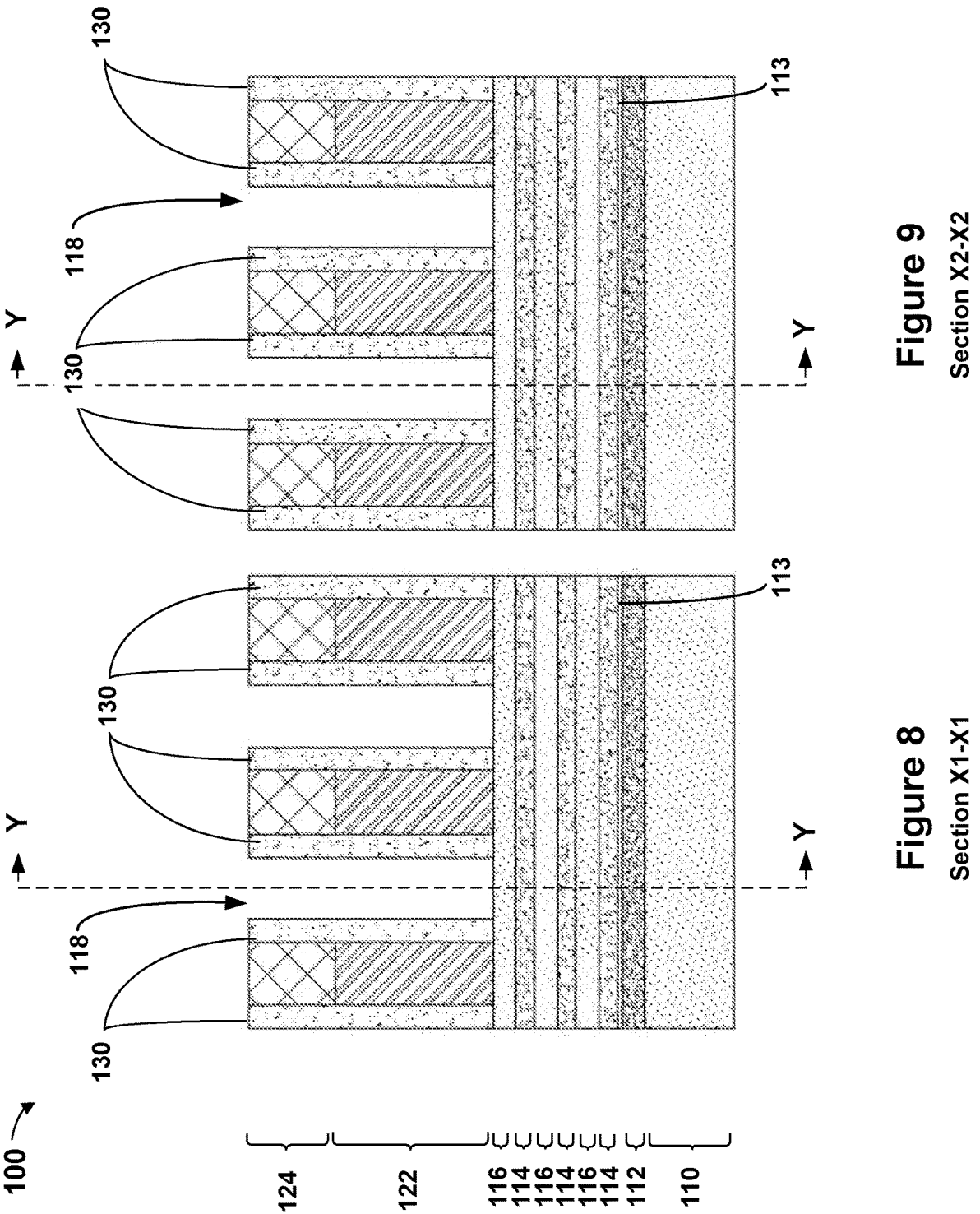
FIGS. 8, 9 and 10 each illustrate a cross-sectional view of the of the semiconductor structure along section lines X1-X1, X2-X2 and Y-Y, respectively, and illustrates formation of a spacer, according to an exemplary embodiment.
Figure 10:
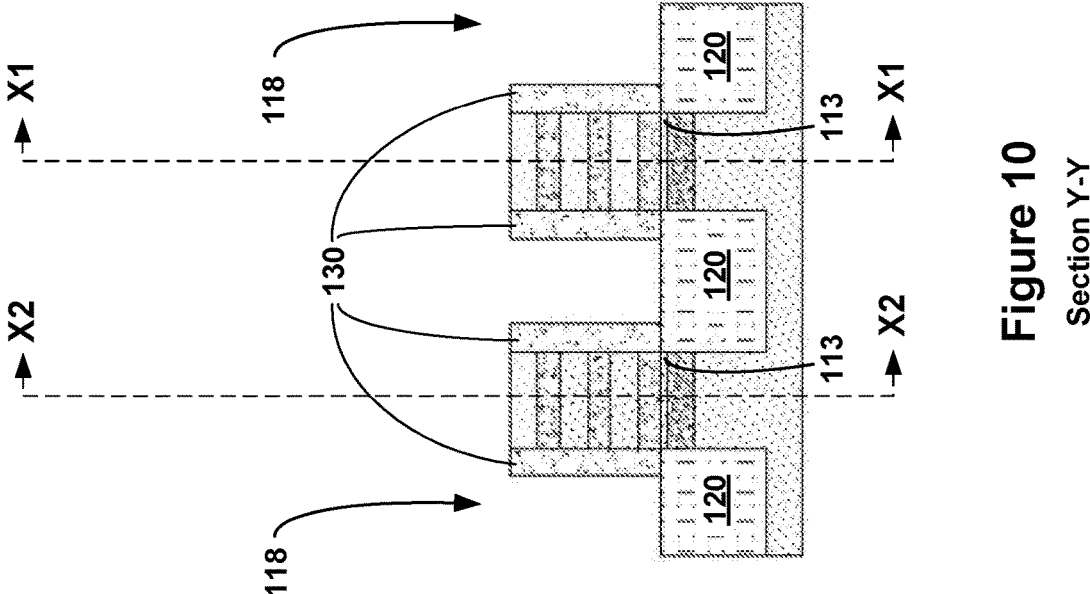
Figure 10:
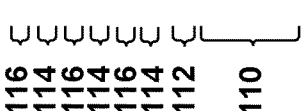

Referring now to FIGS. 8, 9 and 10, the structure 100 is shown according to an exemplary embodiment. FIGS. 8 and 9 are each a cross-sectional view of the structure 100 along section lines X1-X1 and X2-X2, respectively, and are parallel to each other. FIG. 10 is a cross-sectional view of the structure 100 along section line Y-Y and is perpendicular to section lines X1-X1 and X2-X2. A spacer 130 may be formed.

The spacer 130 may be formed on either side of the sacrificial gate 122 and the gate hard mask 124 and on either side of each nanosheet stack. The spacer 130 may be formed on opposite sides of the nanosheet stack between sacrificial gates 122, as shown in FIG. 10.

The spacer 130 may be formed after several processes, including for example, conformally depositing or growing a dielectric and performing an anisotropic etch process. The spacer 130 may include any dielectric material such as a low-k material such as SiON, SiOCN, SiOC and SiBCN, among other materials, and may include a single layer or may include multiple layers of dielectric material.

Figures 11, 12:
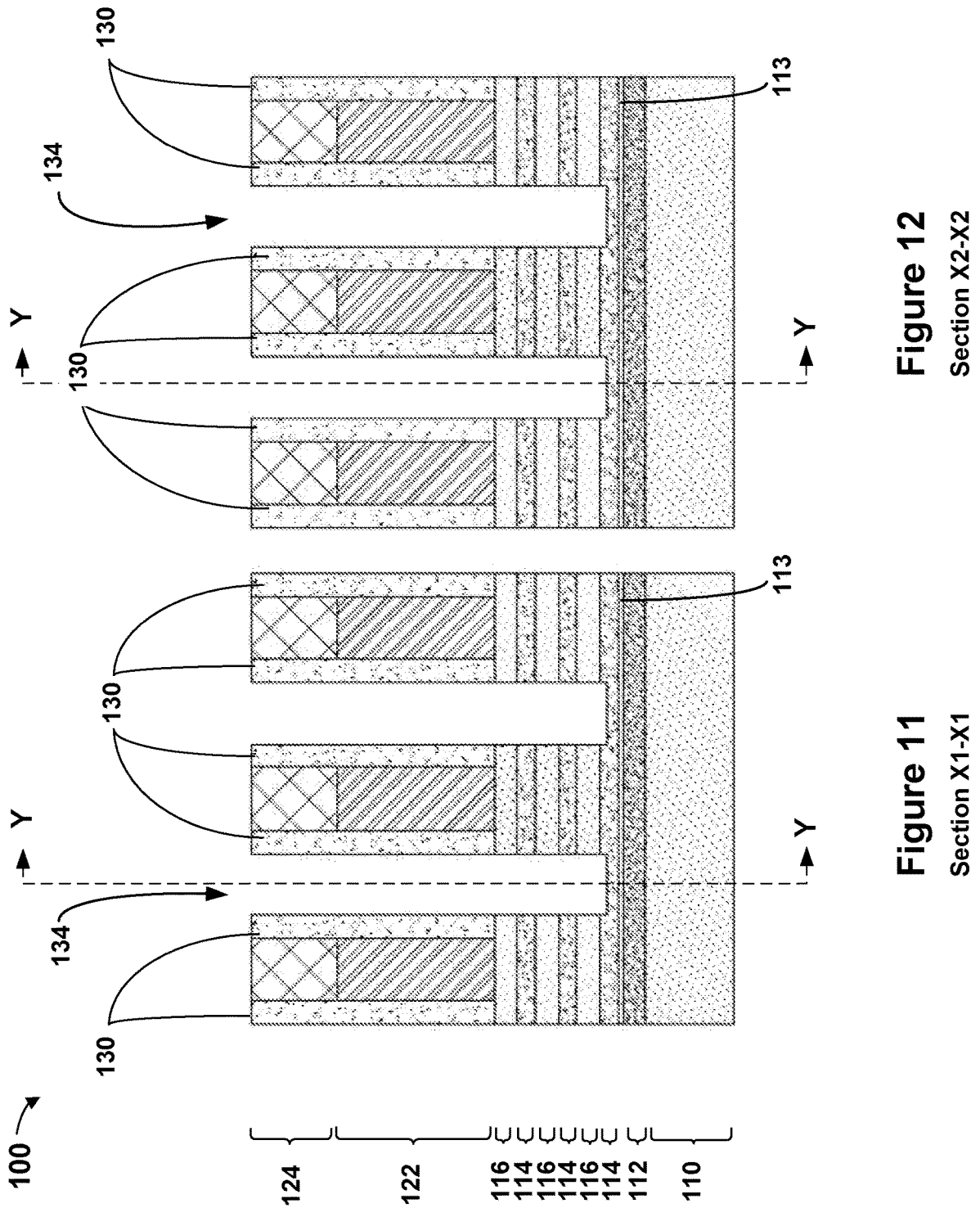
FIGS. 11, 12 and 13 each illustrate a cross-sectional view of the of the semiconductor structure along section lines X1-X1, X2-X2 and Y-Y, respectively, and illustrates formation of a source drain trench in the nanosheet stack.
Figure 13:
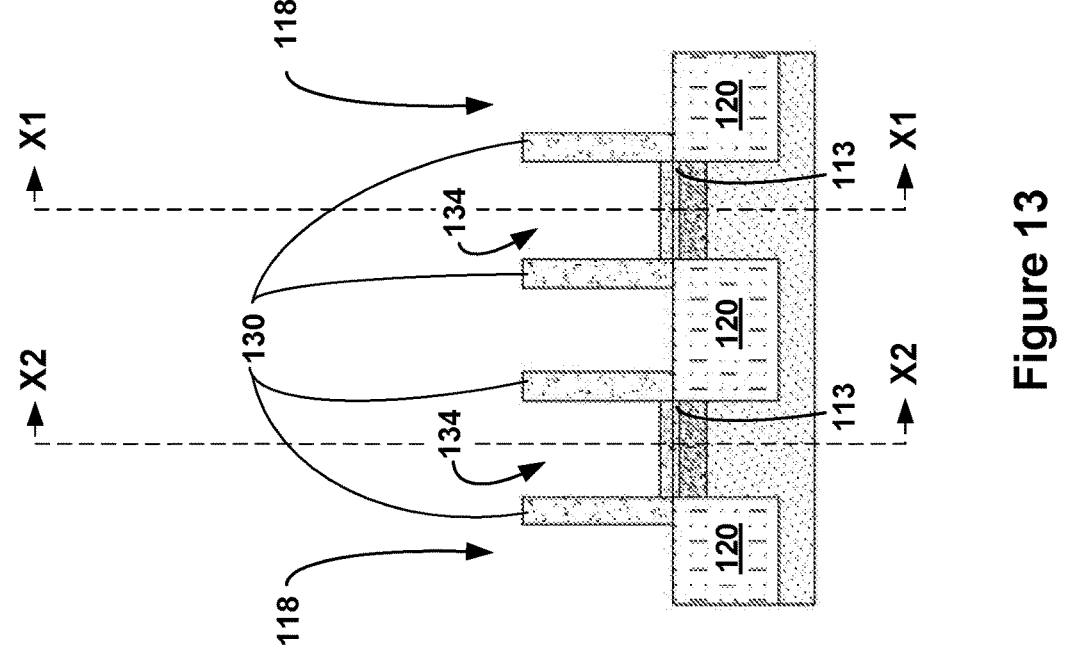
Figure 13:
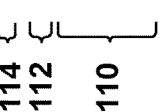

Referring now to FIGS. 11, 12 and 13, the structure 100 is shown according to an exemplary embodiment. FIGS. 11 and 12 are each a cross-sectional view of the structure 100 along section lines X1-X1 and X2-X2, respectively, and are parallel to each other. FIG. 13 is a cross-sectional view of the structure 100 along section line Y-Y and is perpendicular to section lines X1-X1 and X2-X2. A source drain trench 134 may be formed by recessing a vertical portion of the nanosheet stack.

The source drain trench 134 may be formed by an anisotropic etching technique, such as, for example, reactive ion etching (RIE), and etching continues until a portion of the lowermost sacrificial suspension layer 114 of the nanosheet stacks is removed. A lowermost surface of the trench 134 may be below a top surface of the lowermost sacrificial suspension layer 114. The anisotropic etching may remove aligned vertical portions of the stacked nanosheet stack between adjacent sacrificial gates 122, gate hard mask 124 and spacer 130. The sacrificial gate 122, the gate hard mask 124 and the spacers 130 may protect remaining portions of the nanosheet stack. The seed layer 113 and the sacrificial epitaxial layer 112 below the nanosheet stack may remain intact. The vertical portion of the nanosheet stack may be recessed for subsequent formation of a source drain epitaxy in the source drain trench 134. The hard mask (not shown) may be removed.

A resulting structure has the nanosheet stacks remaining as protected by the combined structure of the sacrificial gate 122, gate hard mask 124 and spacer 130, and between these structures a remaining portion of the lowermost sacrificial suspension layer 114 above the seed layer 113 of the nanosheet stacks, and the sacrificial epitaxial layer 112 below the seed layer 113 of the nanosheet stacks remains.

An upper horizontal surface of the remaining portion of the lowermost sacrificial suspension layer 114 may form a lower horizontal surface of the source drain trench 134. Vertical side surfaces of two adjacent spacers 130 may form two opposite sidewalls of the source drain trench 134. Vertical side surfaces of the alternating sacrificial suspension layers 114 and the channel layers 116 of the nanosheet stack may form the remaining two opposite sidewalls of the source drain trench 134.

Figures 14, 15:
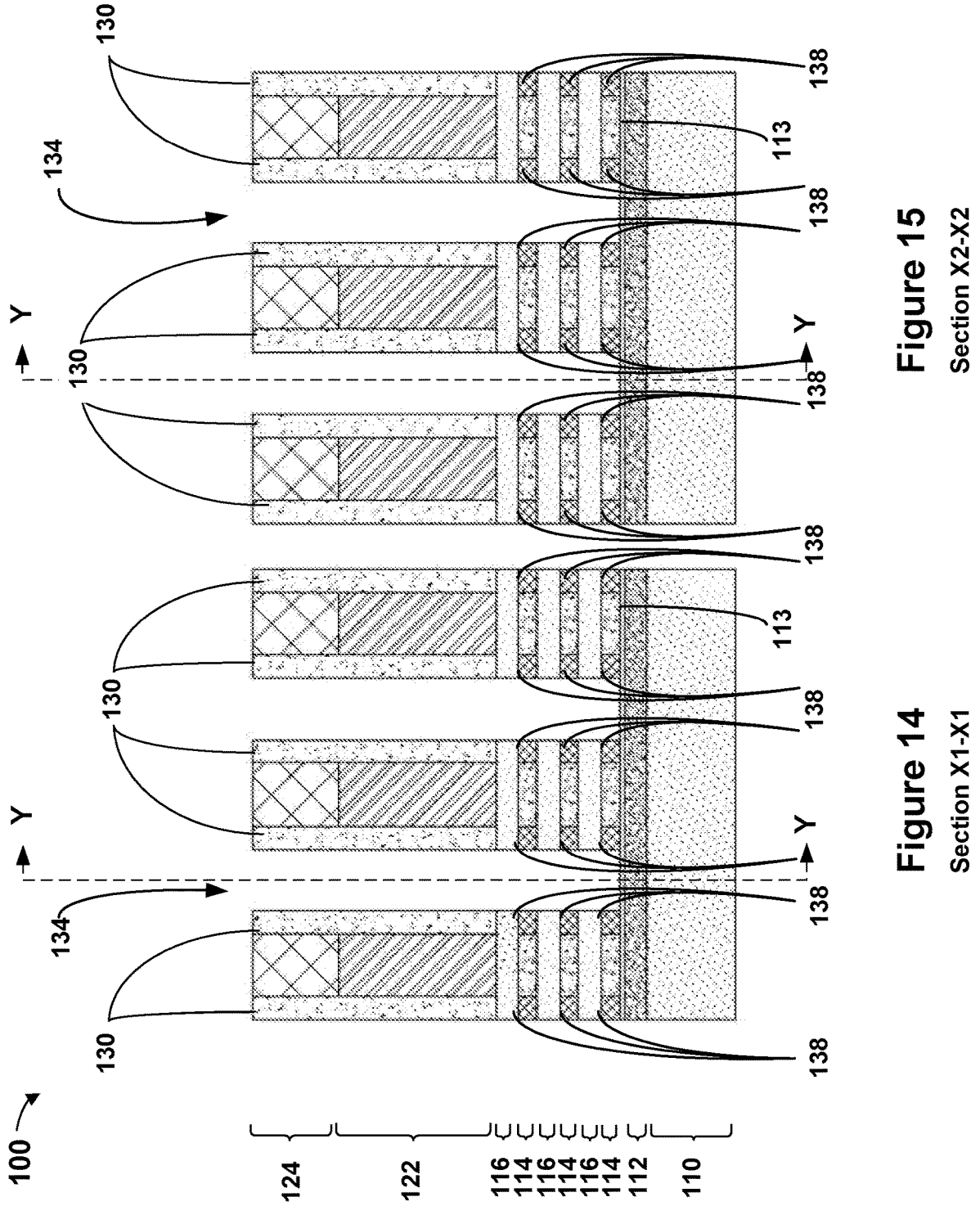

Referring now to FIGS. 14, 15 and 16, the structure 100 is shown according to an exemplary embodiment. FIGS. 14 and 15 are each a cross-sectional view of the structure 100 along section lines X1-X1 and X2-X2, respectively, and are parallel to each other. FIG. 16 is a cross-sectional view of the structure 100 along section line Y-Y and is perpendicular to section lines X1-X1 and X2-X2. A portion of each of the sacrificial suspension layers 114 may be indented, and an inner spacer 138 may be formed on either side of the sacrificial suspension layers 114.

A portion of each of the sacrificial suspension layers 114 on either side of where the vertical portion of the nanosheet stack was recessed, may be indented. The portion of each of the sacrificial suspension layers 114 may be indented selective to the sacrificial gate 122, the gate hard mask 124, the spacer 130, the channel layers 116, the sacrificial epitaxial layer 112 and the STI 120, using methods known in the arts.

While removing the portion of each of the sacrificial suspension layers 114, a remaining portion of the lowermost sacrificial suspension layers 114 which had remained between adjacent nanosheet stacks may be removed, resulting in an exposed upper surface of the seed layer 113.

The inner spacer 138 may be formed on either side of the sacrificial suspension layers 114. Outer vertical sides of the inner spacer 138 may vertically align with the channel layers 116 and inner vertical sides of the inner spacer 138 may vertically align with remaining portions of the sacrificial suspension layers 114.

The inner spacers 138 may be formed after several processes, including for example, conformally depositing or growing a dielectric and performing an isotropic etch process. The inner spacer 138 may include any dielectric material such as silicon nitride and may include a single layer or may include multiple layers of dielectric material.

Figures 17, 18:
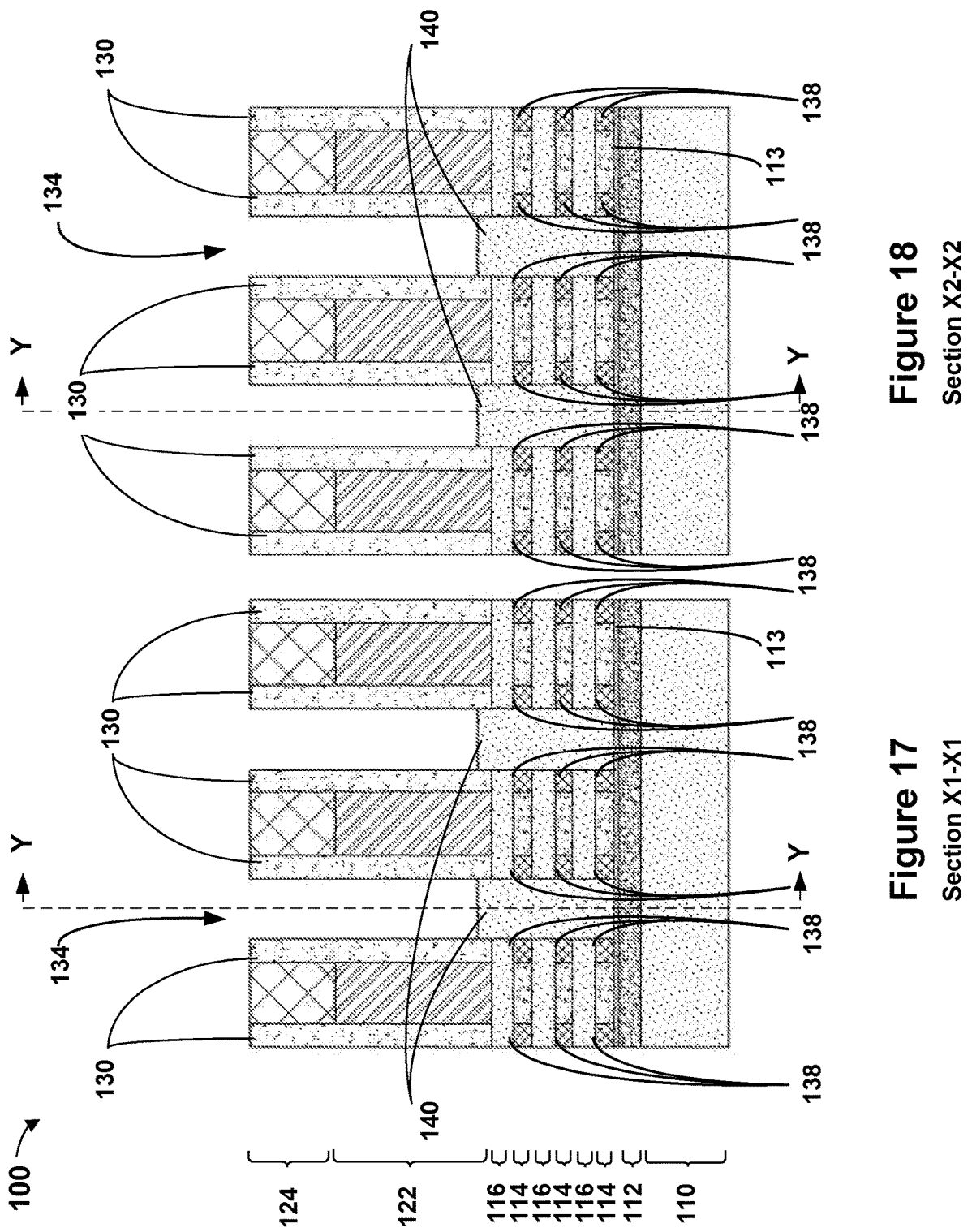
FIGS. 17, 18 and 19 each illustrate a cross-sectional view of the of the semiconductor structure along section lines X1-X1, X2-X2 and Y-Y, respectively, and illustrates formation of an undoped silicon epitaxy.
Figure 19:
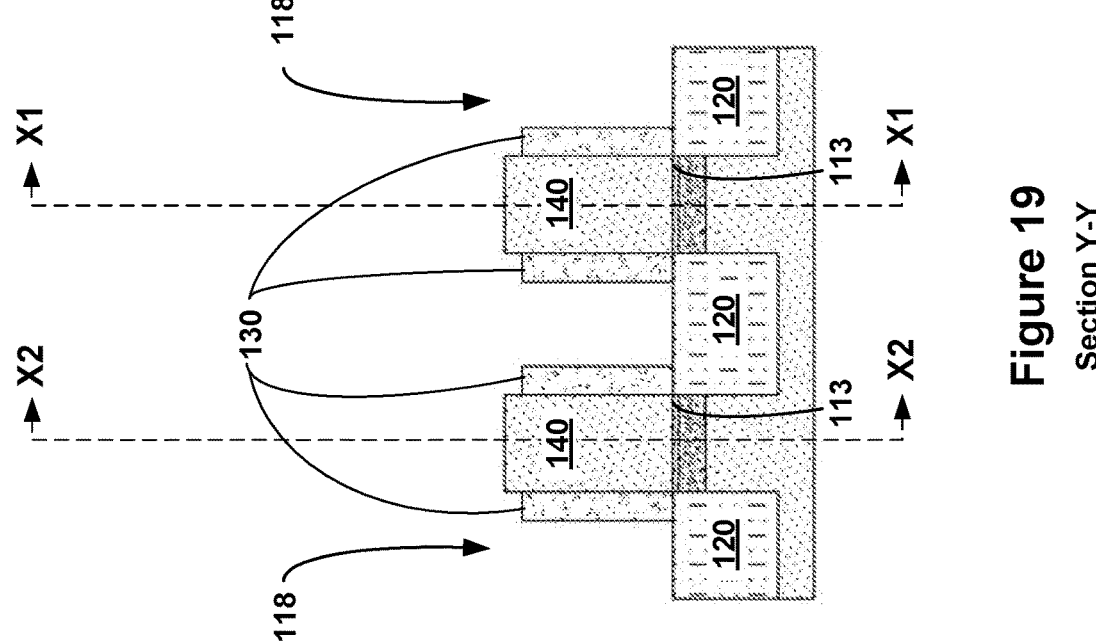
Figure 19:
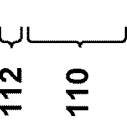

Referring now to FIGS. 17, 18 and 19, the structure 100 is shown according to an exemplary embodiment. FIGS. 17 and 18 are each a cross-sectional view of the structure 100 along section lines X1-X1 and X2-X2, respectively, and are parallel to each other. FIG. 19 is a cross-sectional view of the structure 100 along section line Y-Y and is perpendicular to section lines X1-X1 and X2-X2. An undoped silicon epitaxy 140 may be formed.

The undoped silicon epitaxy 140 may be formed where the vertical portion of each nanosheet stack was removed, in the source drain trench 134, and may be partially recessed using methods known in the art.

The undoped silicon epitaxy 140 may be epitaxially grown, as described above, in a region between adjacent sacrificial gates 122, the gate hard mask 124 and spacers 130, where the vertical portion of the nanosheet stack was recessed. The undoped silicon epitaxy 140 may be in direct contact with end portions of the channel layers 116 of the nanosheet stack and end portions of the inner spacer 138 surrounding the sacrificial suspension layers 114. The undoped silicon epitaxy 140 may be grown from the seed layer 113 at a lower surface of the source drain trenches 134, as well as grown from the channel layers 116.

In this invention, the undoped silicon epitaxy 140 may be grown from the seed layer 113 and the channel layers 116 allowing for a lower defectivity, a higher strain and uniform growth of the undoped silicon epitaxy 140, allowing for an improved performance, while also have a sacrificial epitaxial layer 112 protecting the nanosheet FETs from the substrate 110.

An upper surface of the undoped silicon epitaxy 140 may be at a higher level than the nanosheet stack between adjacent sacrificial gates 122, gate hard mask 124 and spacers 130.

Figures 20, 21:
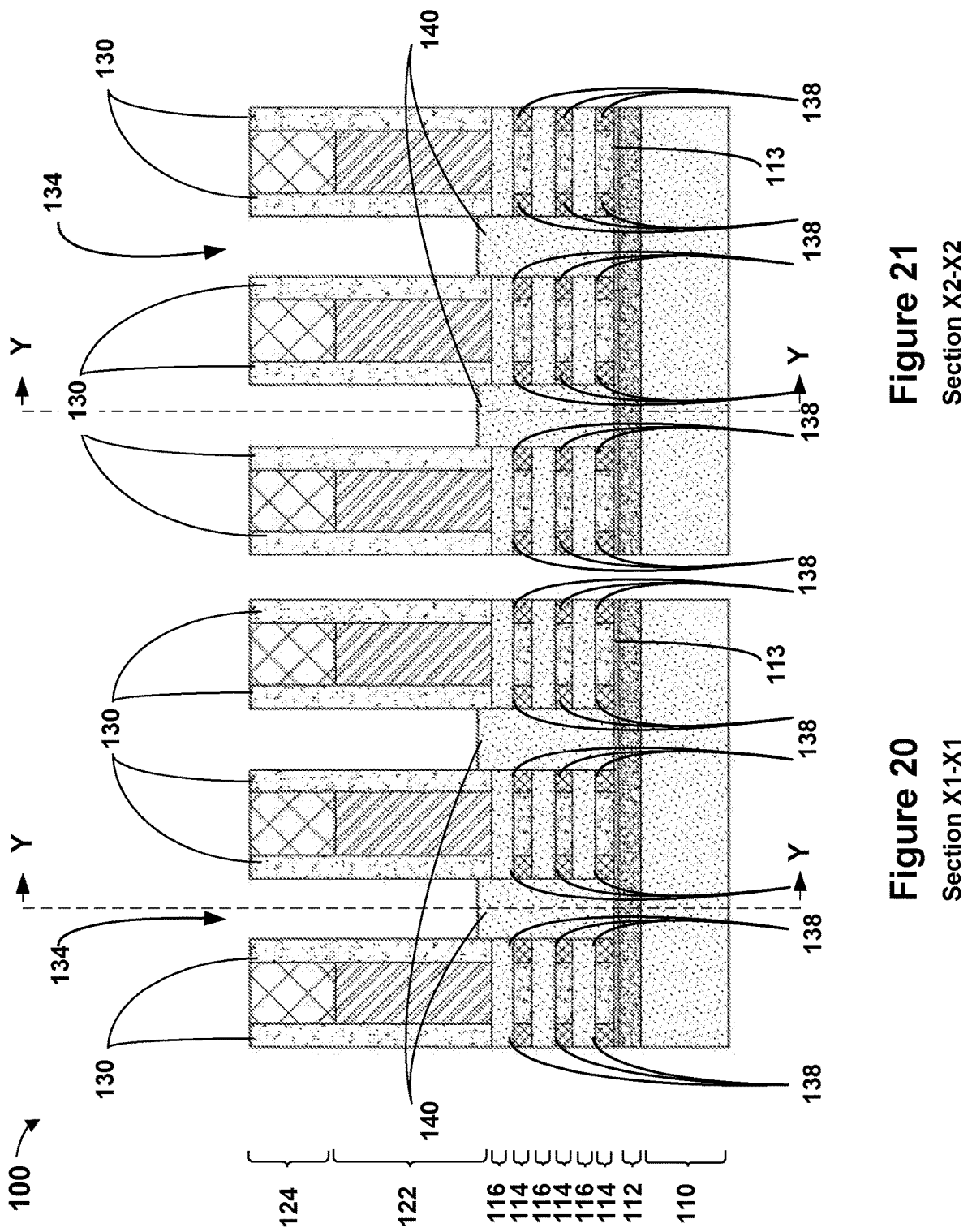
FIGS. 20, 21 and 22 each illustrate a cross-sectional view of the of the semiconductor structure along section lines X1-X1, X2-X2 and Y-Y, respectively, and recessing a shallow trench isolation region.
Figure 22:
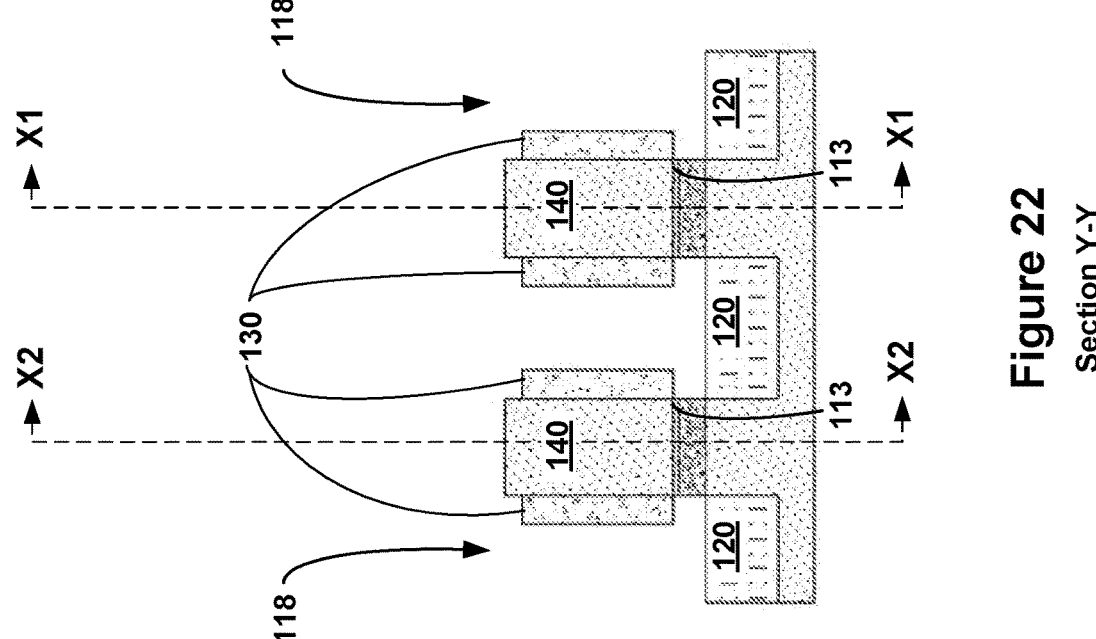
Figure 22:
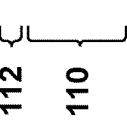

Referring now to FIGS. 20, 21 and 22, the structure 100 is shown according to an exemplary embodiment. FIGS. 20 and 21 are each a cross-sectional view of the structure 100 along section lines X1-X1 and X2-X2, respectively, and are parallel to each other. FIG. 22 is a cross-sectional view of the structure 100 along section line Y-Y and is perpendicular to section lines X1-X1 and X2-X2. A portion of the spacer 130 may be recessed to expose a vertical side surface of the sacrificial epitaxial layer 112.

The portion of the STI 140 may be removed selective to the undoped silicon epitaxy 140, the sacrificial gate 122, the gate hard mask 124, the spacer 130, the channel layers 116, the inner spacers 138, the sacrificial suspension layers 114, the seed layer 113, the sacrificial epitaxial layer 112 and the STI 120, using methods known in the arts. A vertical side surface and a lower surface of the seed layer 113 may be exposed when the portion of the STI 140 is removed. A vertical side surface of the sacrificial epitaxial layer 112 is exposed when the portion of the STI 140 is removed.

Figures 23, 24:
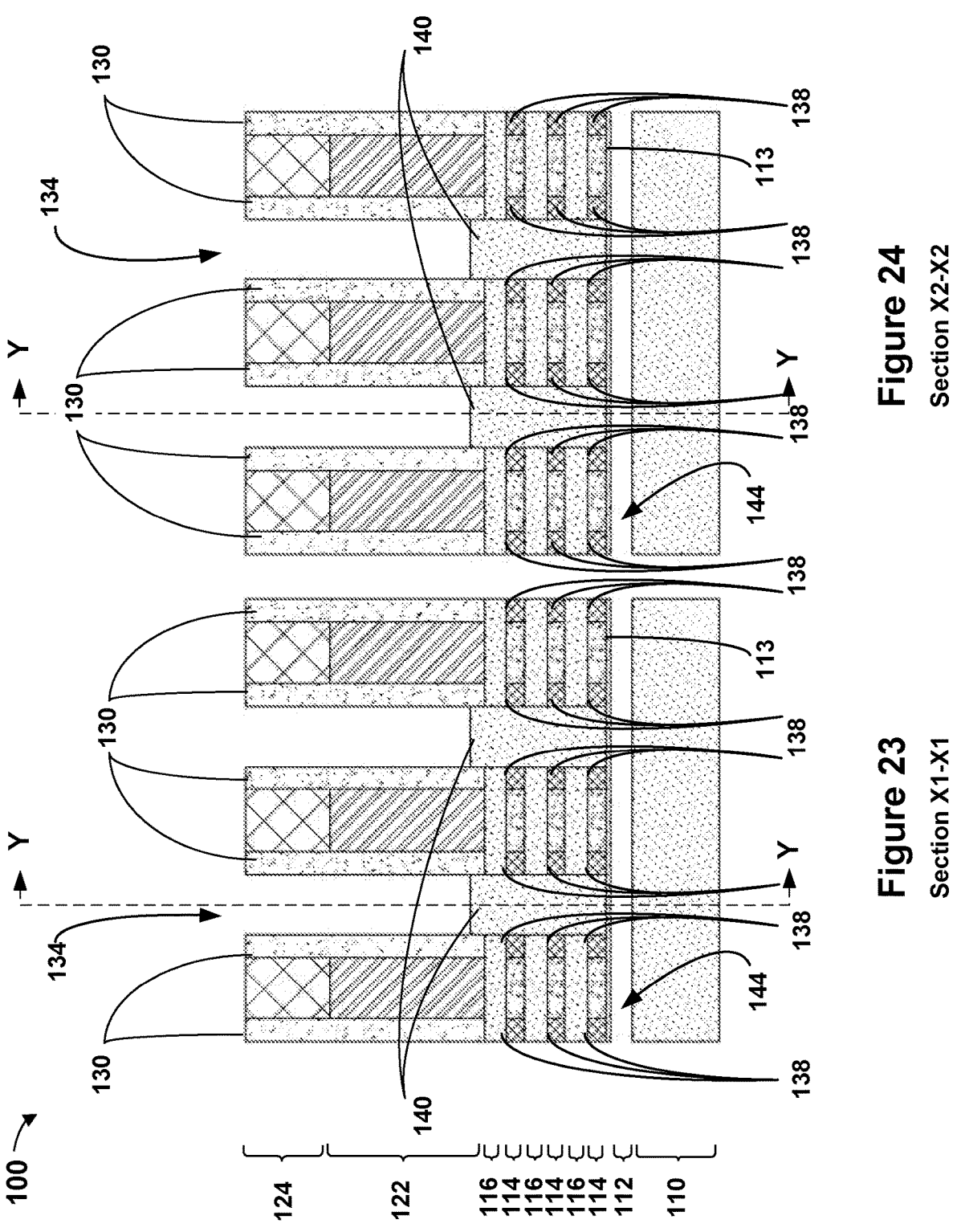
FIGS. 23, 24 and 25 each illustrate a cross-sectional view of the of the semiconductor structure along section lines X1-X1, X2-X2 and Y-Y, respectively, and illustrates removal of a sacrificial epitaxial layer, according to an exemplary embodiment.
Figure 25:
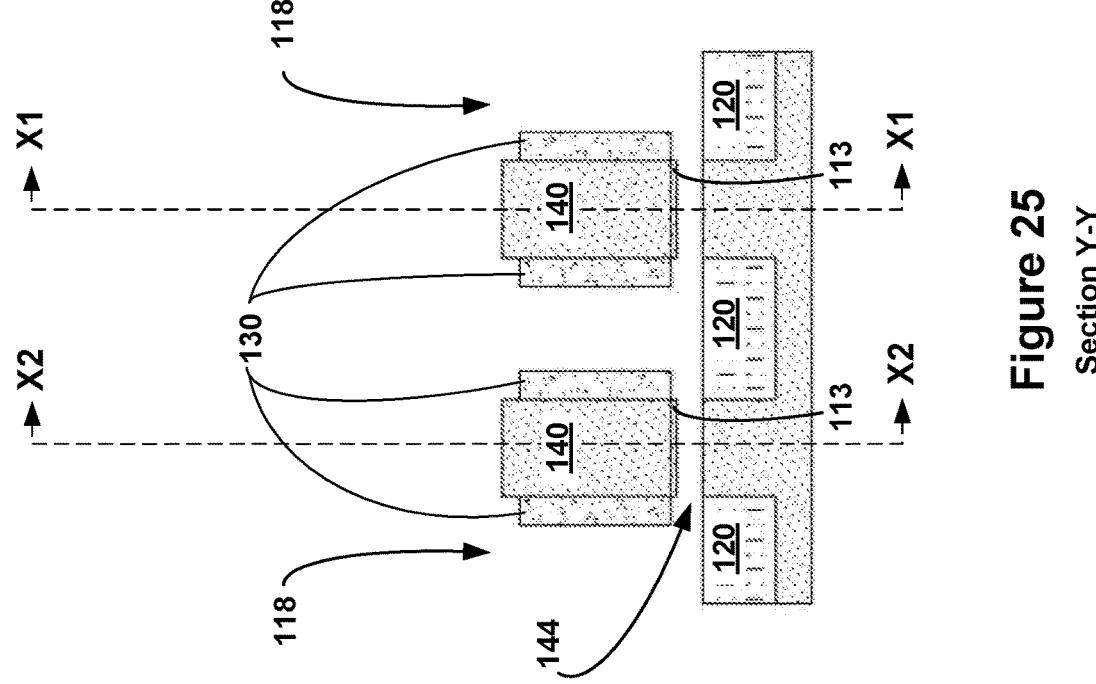

Referring now to FIGS. 23, 24 and 25, the structure 100 is shown according to an exemplary embodiment. FIGS. 23 and 24 are each a cross-sectional view of the structure 100 along section lines X1-X1 and X2-X2, respectively, and are parallel to each other. FIG. 25 is a cross-sectional view of the structure 100 along section line Y-Y and is perpendicular to section lines X1-X1 and X2-X2. The sacrificial epitaxial layer 112 may be removed, forming a gap 144.

The sacrificial epitaxial layer 112 may be removed selective to the seed layer 113, the sacrificial suspension layers 114, the channel layers 116, the substrate 110, the STI 120, the sacrificial gate 122, the gate hard mask 124, the spacer 130 and the undoped silicon epitaxy 140. For example, a dry etching technique can be used to selectively remove the sacrificial epitaxial layer 112, such as, for example, using vapor phase HCl dry etch.

Figures 26, 27:
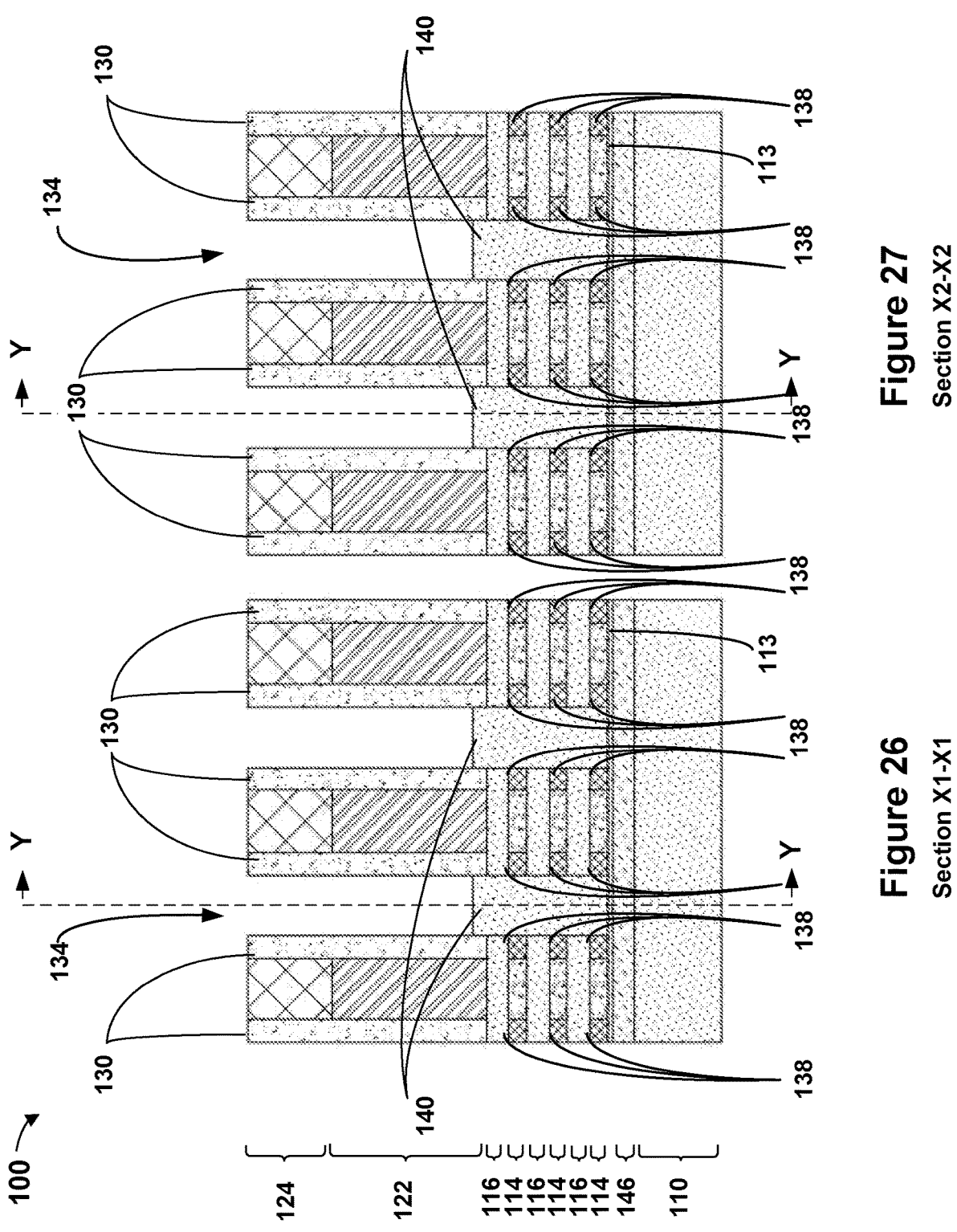
FIGS. 26, 27 and 28 each illustrate a cross-sectional view of the of the semiconductor structure along section lines X1-X1, X2-X2 and Y-Y, respectively, and illustrates formation of a bottom dielectric isolation, according to an exemplary embodiment.
Figure 28:
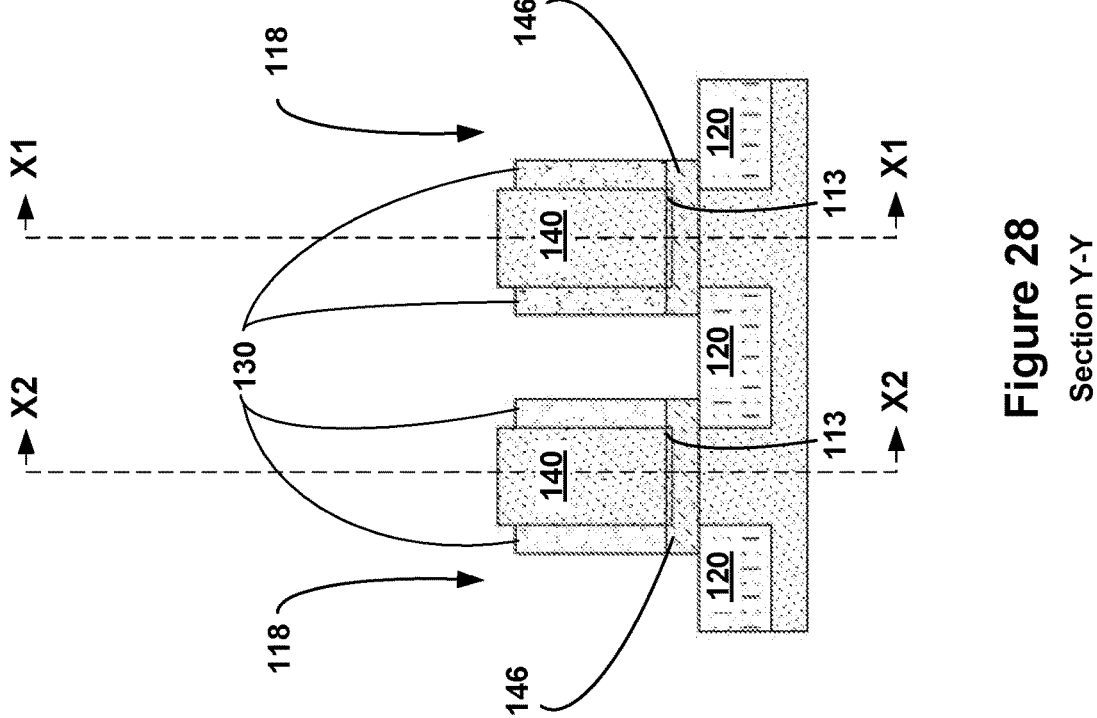

Referring now to FIGS. 26, 27 and 28, the structure 100 is shown according to an exemplary embodiment. FIGS. 26 and 27 are each a cross-sectional view of the structure 100 along section lines X1-X1 and X2-X2, respectively, and are parallel to each other. FIG. 28 is a cross-sectional view of the structure 100 along section line Y-Y and is perpendicular to section lines X1-X1 and X2-X2. A bottom dielectric isolation 146 may be formed in the gap 144.

The bottom dielectric isolation 146 may be formed where the sacrificial epitaxial layer 112 has been removed. The bottom dielectric isolation 146 may be formed between the seed layer 113 of the nanosheet stack and the substrate 110. Vertical side surfaces of the bottom dielectric isolation 146 may align with vertical side surfaces of the spacer 130. A lower horizontal surface of the bottom dielectric isolation 146 may cover a portion of the STI 120.

The bottom dielectric isolation 146 may be formed after several processes, including for example, conformally depositing or growing a dielectric and performing an anisotropic etch process. The bottom dielectric isolation 146 may include any dielectric material such as silicon nitride and may include a single layer or may include multiple layers of dielectric material.

Figures 29, 30:
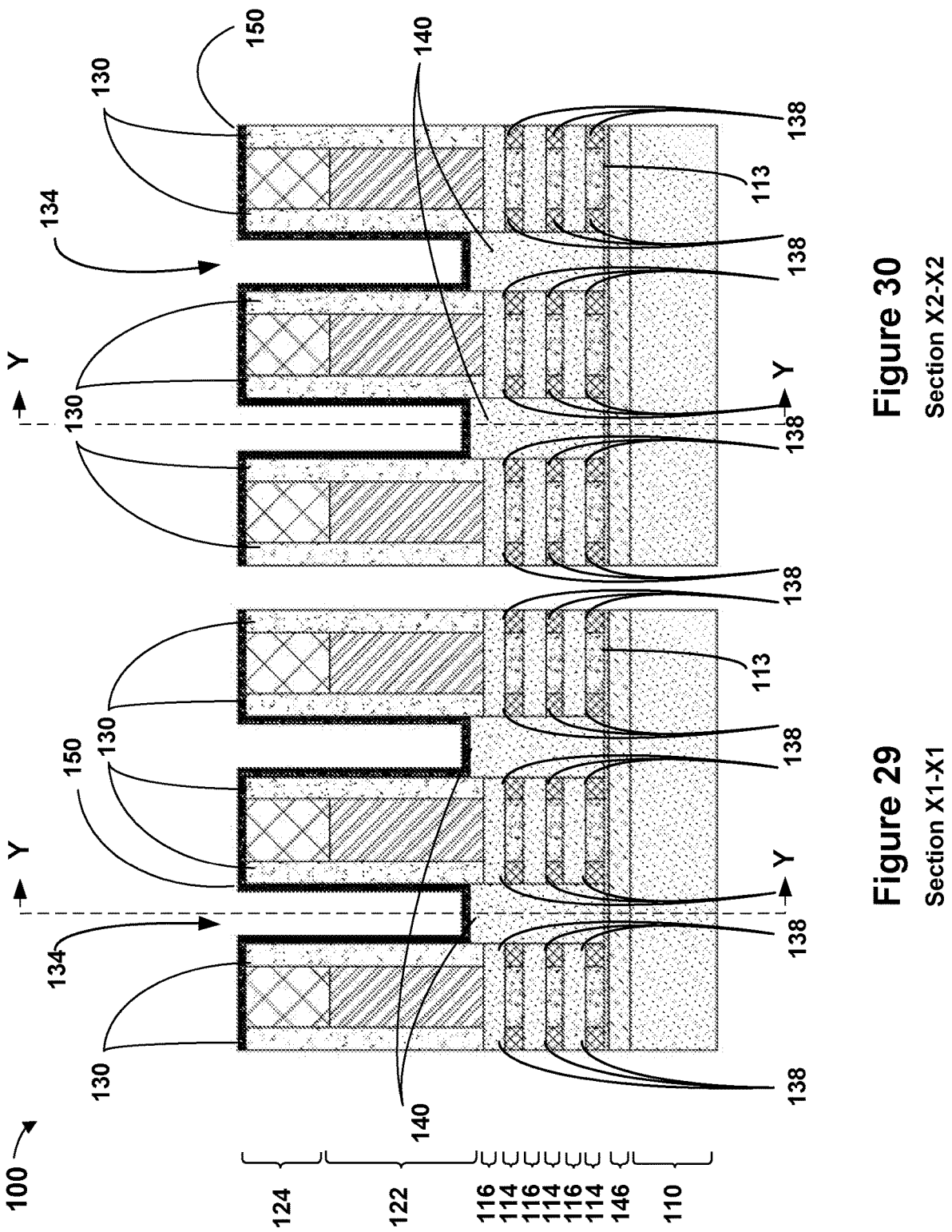
FIGS. 29, 30 and 31 each illustrate a cross-sectional view of the of the semiconductor structure along section lines X1-X1, X2-X2 and Y-Y, respectively, and formation of an etch stop liner, according to an exemplary embodiment.
Figure 31:
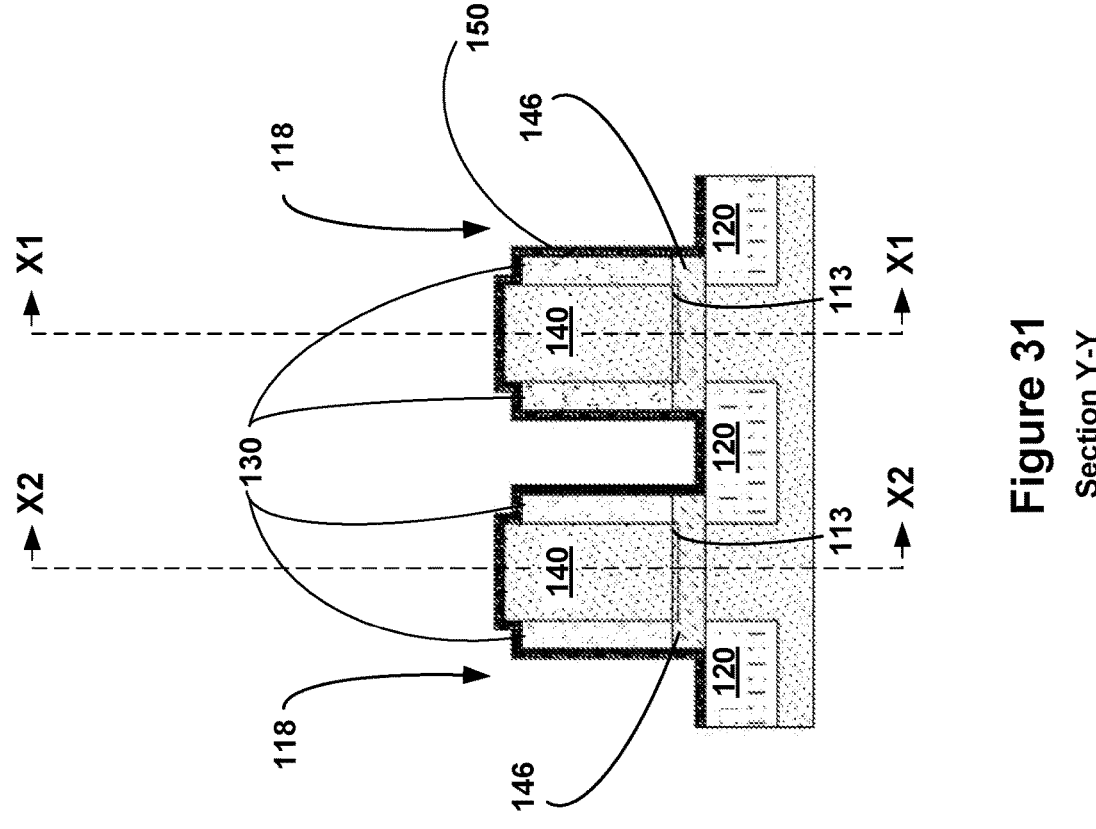

Referring now to FIGS. 29, 30 and 31, the structure 100 is shown according to an exemplary embodiment. FIGS. 29 and 30 are each a cross-sectional view of the structure 100 along section lines X1-X1 and X2-X2, respectively, and are parallel to each other. FIG. 31 is a cross-sectional view of the structure 100 along section line Y-Y and is perpendicular to section lines X1-X1 and X2-X2. An etch stop liner 150 may be formed on the structure 100.

The etch stop liner 150 may be conformally formed on the structure 100. The etch stop liner 150 may cover an upper surface of the undoped silicon epitaxy 140, an upper surface and outer side surface of the spacer 130, a vertical side surface of the bottom dielectric isolation 146, an upper surface of the STI 120, and an upper surface of the gate hard mask 124. The etch stop liner 150 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the etch stop liner 150 may include one or more layers. The etch stop liner 150 may include materials such as a nitride, a silicon nitride and an oxide. The etch stop liner 150 may be referred to as a contact etch stop layer (CESL) 150. The etch stop liner 150 may be 4 nm thick.

Figures 32, 33:
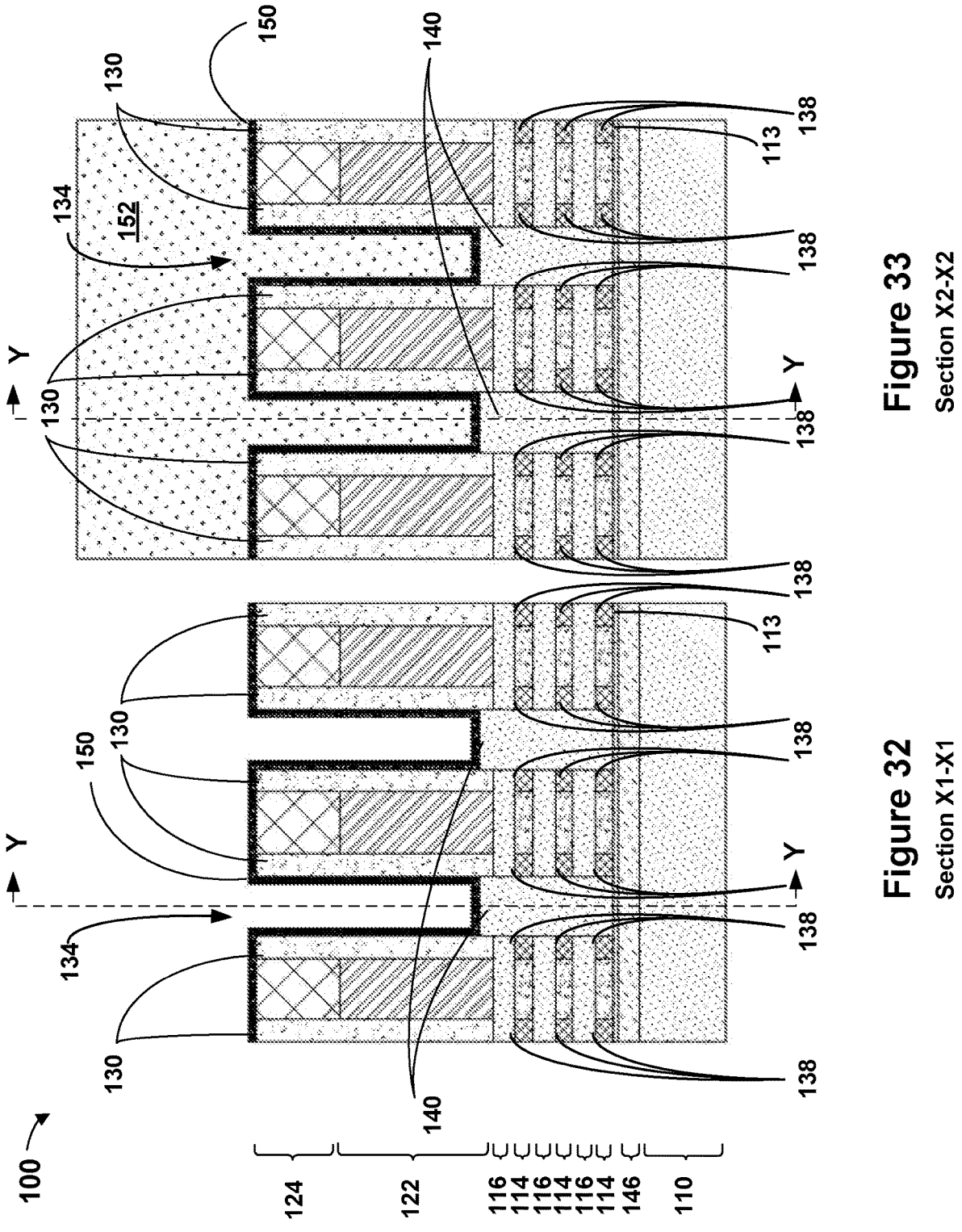
FIGS. 32, 33 and 34 each illustrate a cross-sectional view of the of the semiconductor FIGS. 32, 33 and 34 each illustrate a cross-sectional view of the of the semiconductor structure along section lines X1-X1, X2-X2 and Y-Y, respectively, and illustrates formation of a first organic planarization layer, according to an exemplary embodiment.
Figure 34:
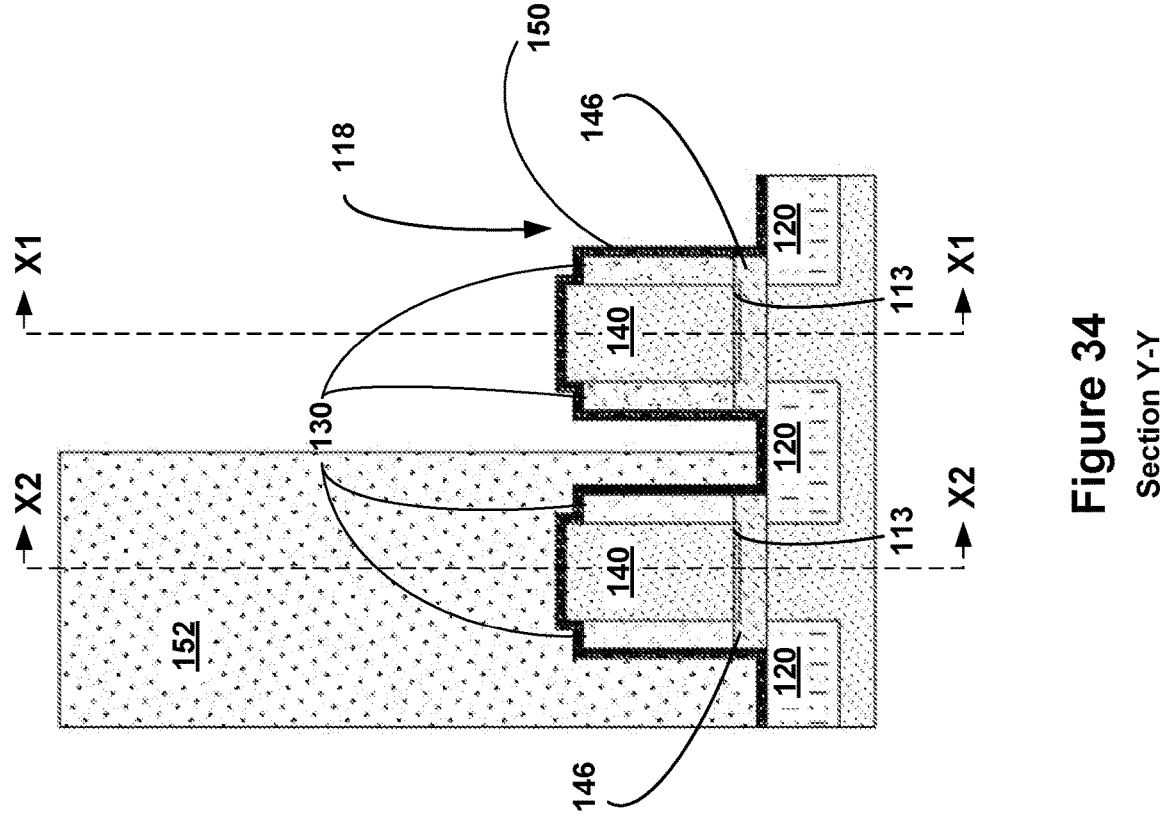
Figure 34:
Figure 34:
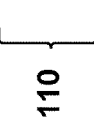

Referring now to FIGS. 32, 33 and 34, the structure 100 is shown according to an exemplary embodiment. FIGS. 32 and 33 are each a cross-sectional view of the structure 100 along section lines X1-X1 and X2-X2, respectively, and are parallel to each other. FIG. 34 is a cross-sectional view of the structure 100 along section line Y-Y and is perpendicular to section lines X1-X1 and X2-X2. A first organic planarization layer (hereinafter "first OPL") 152 may be formed on the structure 100.

The first OPL 152 may be deposited and patterned on the structure 100. The first OPL 152 may protect select sacrificial gates 122, the gate hard mask 124, the spacer 130, the undoped silicon epitaxy 140, the etch stop liner 150 and the STI 120 surrounding the sacrificial gates 122 along section line X2-X2.

The first OPL 152 may be formed by a blanket deposition using typical deposition techniques, for example spin-on coating. The first OPL 152 can be a self-planarizing organic material that includes carbon, hydrogen, oxygen, and optionally nitrogen, fluorine, and silicon. The first OPL 152 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

The first OPL 152 may be referred to as a first trench contact patterning mask. The first OPL 152 may provide access for subsequent patterning of the sacrificial gates 122 and surrounding materials along section line X1-X1 which are not protected by the first OPL 152.

Figures 35, 36:
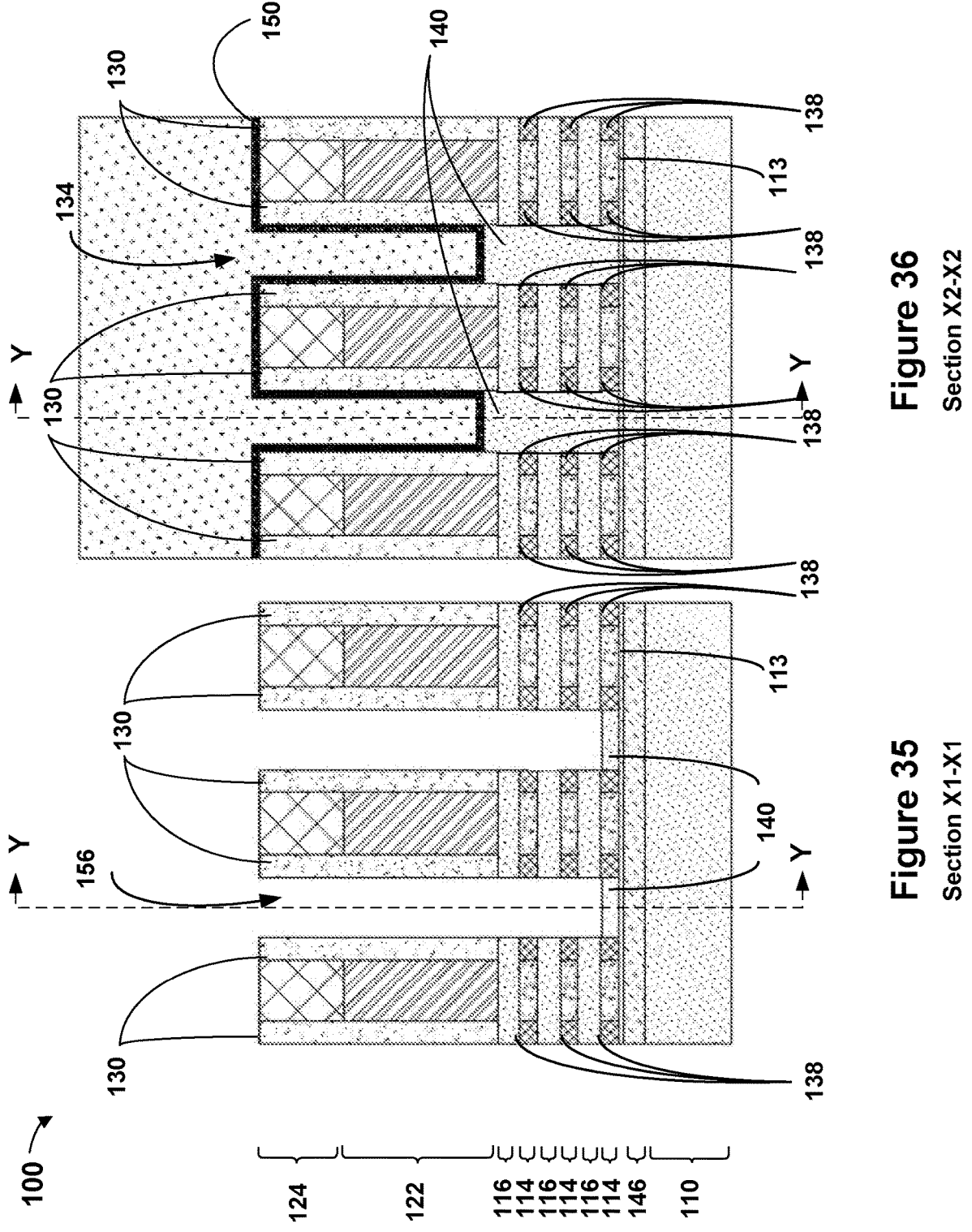
FIGS. 35, 36 and 37 each illustrate a cross-sectional view of the of the semiconductor structure along section lines X1-X1, X2-X2 and Y-Y, respectively, and illustrates formation of a p-FET source drain trench, according to an exemplary embodiment.
Figure 37:
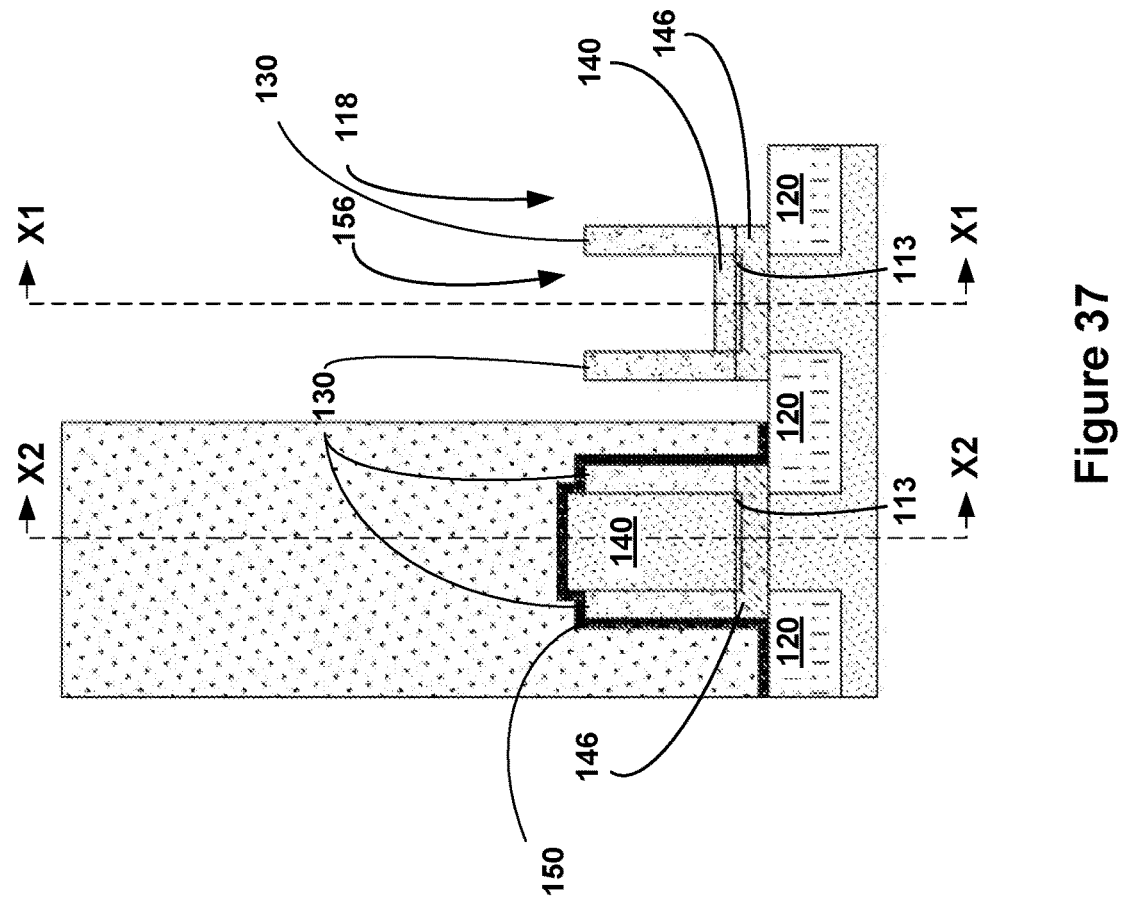

Referring now to FIGS. 35, 36 and 37, the structure 100 is shown according to an exemplary embodiment. FIGS. 35 and 36 are each a cross-sectional view of the structure 100 along section lines X1-X1 and X2-X2, respectively, and are parallel to each other. FIG. 37 is a cross-sectional view of the structure 100 along section line Y-Y and is perpendicular to section lines X1-X1 and X2-X2. A portion of the etch stop liner 150 and a portion of the undoped silicon epitaxy 140 may be removed between sacrificial gates 122 along section line X1-X1, forming a p-FET source drain trench 156.

The p-FET source drain trench 156 may be formed between each spacer 130 surrounding each sacrificial gate 122 and gate hard mask 124 along section line X1-X1 by an anisotropic etching technique, such as, for example, reactive ion etching (RIE), removing a portion of the undoped silicon epitaxy 140, where a remaining portion of the undoped silicon epitaxy 140 remains over the bottom dielectric isolation 36. Removal of the portion of the etch stop liner 150 and the portion of the undoped silicon epitaxy 140 selective to the channel layers 116, the sacrificial suspension layers 114, the inner spacers 138, the bottom dielectric isolation 146, the seed layer 113 and the STI 120. A vertical side surface may be exposed of each of the spacers 130 channel layers 116 and the inner spacers 138. A portion of an upper surface of the STI 120 may be exposed.

The p-FET source drain trench 156 may be referred to as a self-aligned source drain epitaxy cut as the spacer 130 helps to protect the sacrificial gate 122, the gate hard mask 124, the channels layers 116 and the inner spacers 138. The etch stop liner 150 patterning and removal does not damage inner spacer 138.

Figures 38, 39:
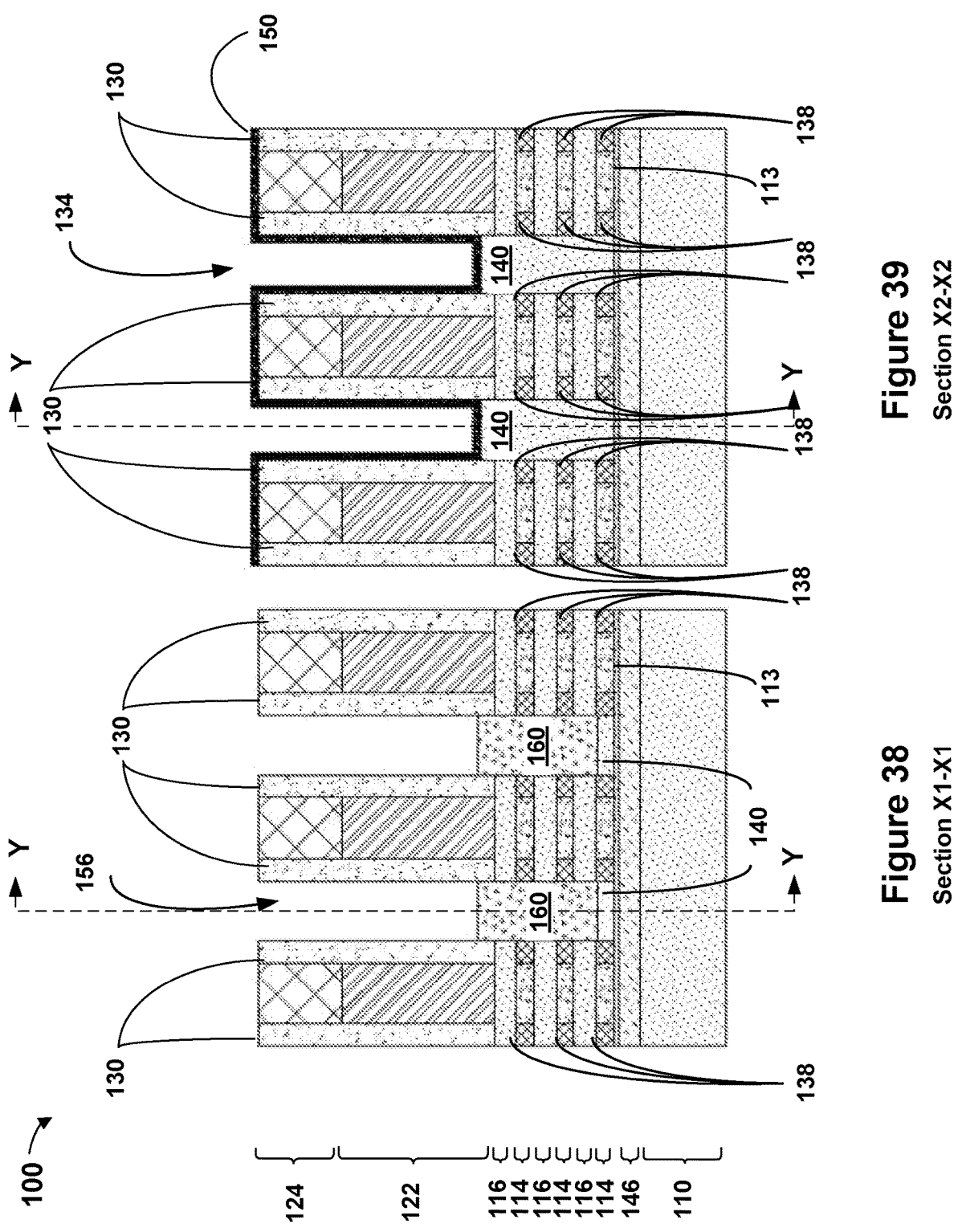
FIGS. 38, 39 and 40 each illustrate a cross-sectional view of the of the semiconductor structure along section lines X1-X1, X2-X2 and Y-Y, respectively, and illustrates formation of a p-FET source drain epitaxy, according to an exemplary embodiment.
Figure 40:
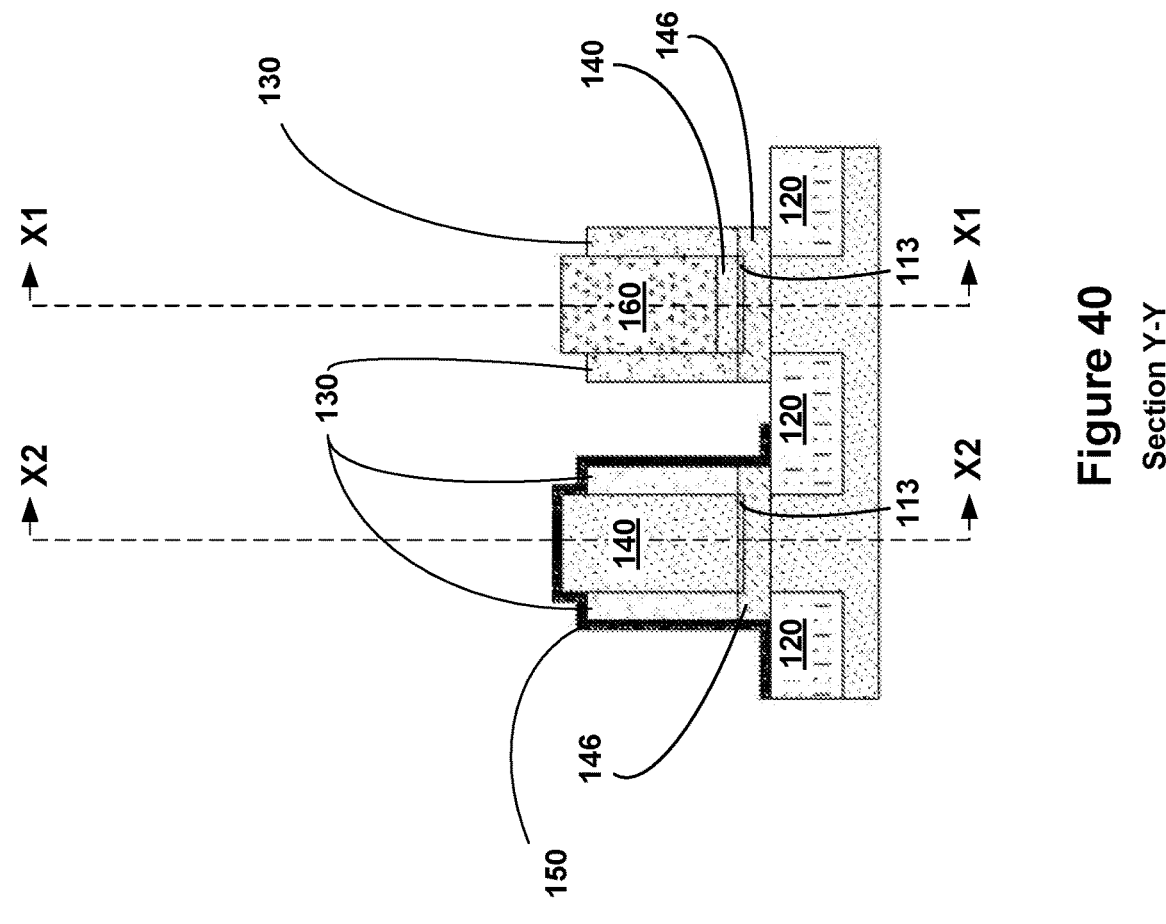

Referring now to FIGS. 38, 39 and 40, the structure 100 is shown according to an exemplary embodiment. FIGS. 38 and 39 are each a cross-sectional view of the structure 100 along section lines X1-X1 and X2-X2, respectively, and are parallel to each other. FIG. 40 is a cross-sectional view of the structure 100 along section line Y-Y and is perpendicular to section lines X1-X1 and X2-X2. A p-FET source drain epitaxy 160 may be formed. The first OPL 152 may be removed.

The p-FET source drain epitaxy 160 may be epitaxially grown in a region on between adjacent sacrificial gates 122, gate hard mask 124 and spacers 130, in the p-FET source drain trench 156. The p-FET source drain epitaxy 160 may be in direct contact with end portions of the channel layers 116 of the nanosheet stack and end portions of the inner spacer 138 surrounding the sacrificial layers 114, along section line X1-X1. The p-FET source drain epitaxy 160 may be formed over the undoped silicon epitaxy 140. The p-FET source drain epitaxy 160 may have two opposite side surfaces of the spacer 130, and may have two additional opposite side surfaces of the nanosheet stack side surfaces of the inner spacer 138 and the channel layers 116. An upper horizontal surface of the p-FET source drain epitaxy 160 may be above an upper surface of an uppermost layer of the nanosheet stacks.

The p-FET source drain epitaxy 160 is formed by epitaxial growth of a semiconductor material on physically exposed sidewalls of each channel layer 116 and from the undoped silicon epitaxy 140.

A key benefit of this invention is the p-FET source drain epitaxy 160 can grow from both the exposed sidewalls of each channel layer 116 and from the undoped silicon epitaxy 140, allowing for a high quality {100}-orientated crystalline growth, allowing the generation of compressive strain on the channel layers 116 of a result p-FET.

The p-FET source drain epitaxy 160 includes any semiconductor material described above with respect to the substrate 102. In some embodiments, the p-FET source drain epitaxy 160 may include the same semiconductor material as the channel layers 116. In other embodiments, the p-FET source drain epitaxy 160 may include a different semiconductor material than that of the channel layers 116. For example, the p-FET source drain epitaxy 160 may include a silicon germanium alloy, while the channel layers 116 may comprise silicon. The p-FET source drain epitaxy 160 may further be doped. Acceptable dopants may include either a p-type dopant or an n-type dopant. The term "p-type" refers to the addition of impurities to an intrinsic semiconductor that creates deficiencies of valence electrons. In a silicon-containing semiconductor material, examples of p-type dopants, include, but are not limited to, aluminum, beryllium, boron, cadmium, gallium, germanium, indium, silicon, and zinc. The term "n-type" refers to the addition of impurities that contributes free electrons to an intrinsic semiconductor. In a silicon containing semiconductor material, examples of n-type dopants include, but are not limited to, antimony, arsenic, germanium, phosphorous, selenium, silicon, and tellurium. In an embodiment, the p-FET source drain epitaxy 160 includes any semiconductor material described above is doped with p-type dopant for p-type FETs along the X1-X1 section.

In an embodiment, the p-type dopant may be heavily doped at levels of $5\times10^{20}$ atoms/cm3 to $1\times10^{21}$ atoms/cm$^3$, although dopant levels may be high or lower and are dependent upon atoms used as dopants. In an embodiment, the n-type dopant may be heavily doped at levels of $1\times10^{29}$ atoms/cm$^3$ to $2\times10^{29}$ atoms/cm$^3$, although dopant levels may be high or lower and are dependent upon atoms used as dopants. In an embodiment, the undoped silicon epitaxy 140 may be doped at levels between about $1\times10^{15}$ cm$^3$ and $1\times10^{16}$ atoms/cm$^3$, although dopant levels may be high or lower and are dependent upon atoms used as dopants. A dopant level in the p-FET source drain epitaxy 160 may be at least 1000 times higher than that in the undoped silicon epitaxy 140.

Figures 41, 42:
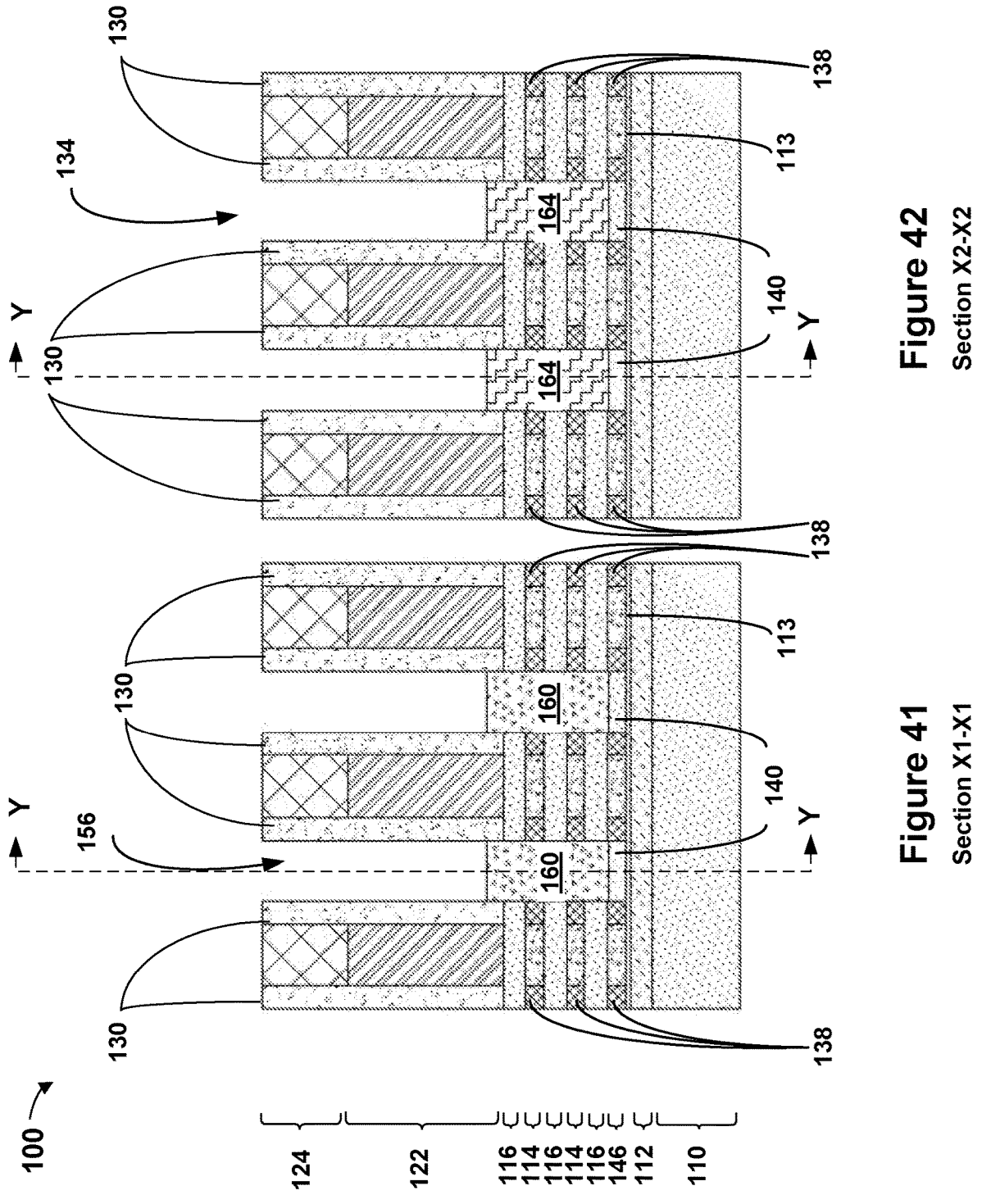
FIGS. 41, 42 and 43 each illustrate a cross-sectional view of the of the semiconductor structure along section lines X1-X1, X2-X2 and Y-Y, respectively, and illustrates formation of an n-FET source drain epitaxy, according to an exemplary embodiment.
Figure 43:
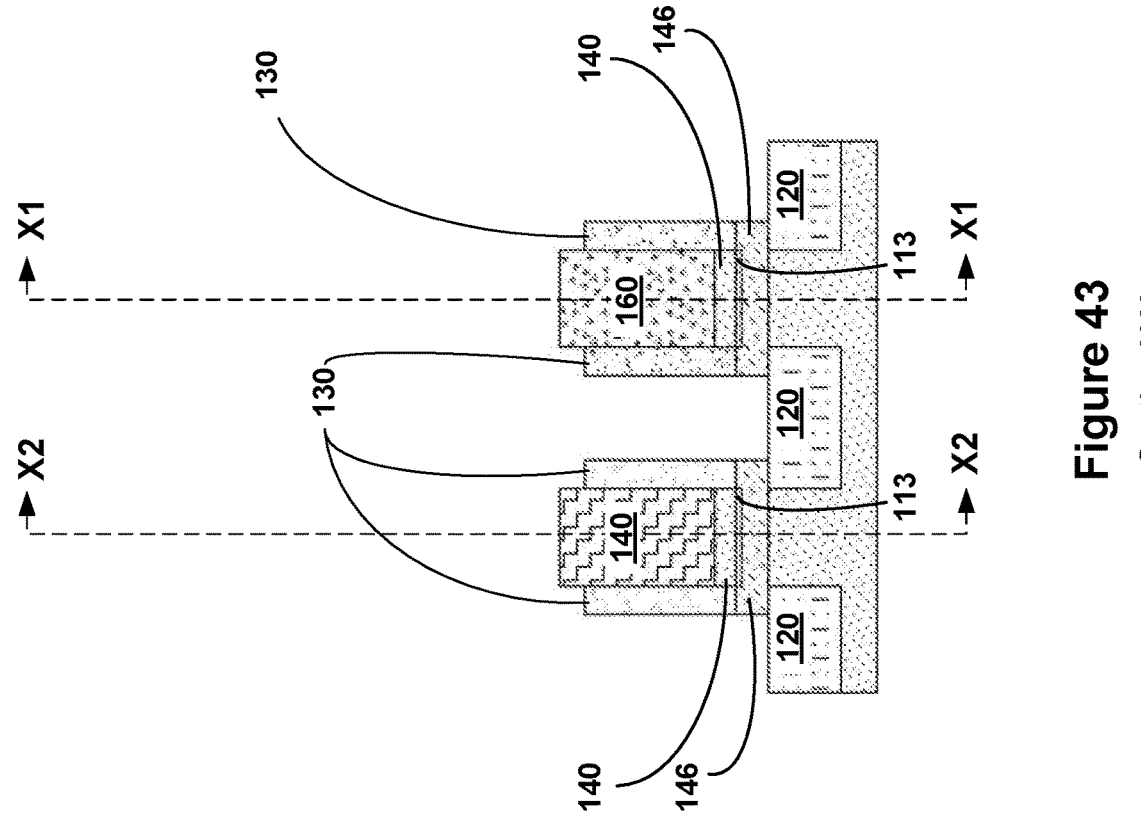

Referring now to FIGS. 41, 42 and 43, the structure 100 is shown according to an exemplary embodiment. FIGS. 41 and 41 are each a cross-sectional view of the structure 100 along section lines X1-X1 and X2-X2, respectively, and are parallel to each other. FIG. 43 is a cross-sectional view of the structure 100 along section line Y-Y and is perpendicular to section lines X1-X1 and X2-X2. An n-FET source drain epitaxy 164 may be formed.

Several steps similar to those described above may be performed. Another etch stop liner (not shown) may be conformed formed on the structure 100, similar to the etch stop liner 150. A second OPL (not shown), similar to the first OPL 152, may be deposited and patterned on the structure 100, along the X1-X1 section, surrounding sacrificial gates 122 and surrounding materials along section line X2-X2, such that sacrificial gates 122 and surrounding materials are not covered by the second OPL (not shown) along section line X1-X1. A portion of the another etch stop liner (not shown) and a portion of the undoped silicon epitaxy 140 may be removed between sacrificial gates 122 along section line X2-X2, forming an n-FET source drain trench (not shown), similar to the p-FET source drain trench 156. The n-FET source drain epitaxy 164 may be formed in the n-FET source drain trench (not shown), similar to the p-FET source drain epitaxy 160. The second OPL (not shown) may be removed.

The n-FET source drain epitaxy 164 may be epitaxially grown in a region on between adjacent sacrificial gates 122, gate hard mask 124 and spacers 130, in the n-FET source drain trench (not shown). The n-FET source drain epitaxy 164 may be in direct contact with end portions of the channel layers 116 of the nanosheet stack and end portions of the inner spacer 138 surrounding the sacrificial layers 114, along section line X2-X2. The n-FET source drain epitaxy 164 may be formed over the undoped silicon epitaxy 140. The n-FET source drain epitaxy 164 may have two opposite side surfaces of the spacer 130, and may have two additional opposite side surfaces of the nanosheet stack side surfaces of the inner spacer 138 and the channel layers 116. An upper horizontal surface of the n-FET source drain epitaxy 164 may be above an upper surface of an uppermost layer of the nanosheet stacks.

The n-FET source drain epitaxy 164 is formed by epitaxial growth of a semiconductor material on physically exposed sidewalls of each channel layer 116 and from the undoped silicon epitaxy 140.

A key benefit of this invention is the n-FET source drain epitaxy 160 can grow from both the exposed sidewalls of each channel layer 116 and from the undoped silicon epitaxy 140, allowing for a high quality 100 crystalline growth, allowing for the generation of tensile strain on the nFET nanosheet channels.

The n-FET source drain epitaxy 164 includes any semiconductor material described above with respect to the substrate 100. In some embodiments, the n-FET source drain epitaxy 164 may include the same semiconductor material as that of the channel layers 116. In other embodiments, the n-FET source drain epitaxy 164 may include a different semiconductor material than that of the channel layers 116. For example, the n-FET source drain epitaxy 164 may include SiC doped with phosphorous, while the channel layers 116 may comprise silicon. The n-FET source drain epitaxy 164 may further be doped. Acceptable dopants may include either a p-type dopant or an n-type dopant. The term "p-type" refers to the addition of impurities to an intrinsic semiconductor that creates deficiencies of valence electrons. In a silicon-containing semiconductor material, examples of p-type dopants, include, but are not limited to, aluminum, beryllium, boron, cadmium, gallium, germanium, indium, silicon, and zinc. The term "n-type" refers to the addition of impurities that contributes free electrons to an intrinsic semiconductor. In a silicon containing semiconductor material, examples of n-type dopants include, but are not limited to, antimony, arsenic, germanium, phosphorous, selenium, silicon, and tellurium.

In an embodiment, the n-FET source drain epitaxy 164 is doped with n-type dopant for n-type FETs along the X2-X2 section.

As described above, in an embodiment, the n-type dopant may be doped at levels of $1\times10^{29}$ atoms/cm$^3$ to $2\times10^{29}$ atoms/cm$^3$, although dopant levels may be high or lower and are dependent upon atoms used as dopants. In an embodiment, the undoped silicon epitaxy 140 may be doped at levels between about $1\times10^{15}$ cm$^3$ and $1\times10^{16}$ atoms/cm$^3$, although dopant levels may be high or lower and are dependent upon atoms used as dopants. A dopant level in the n-FET source drain epitaxy 164 may be at least 1000 times higher than that in the undoped silicon epitaxy 140.

In an embodiment, p-type FETs are made along section line X1-X1 and n-type FETs are made along section line X2-X2. Any combination of p-type FETs and n-type FETs may be made on the structure 100.

Figures 44, 45:
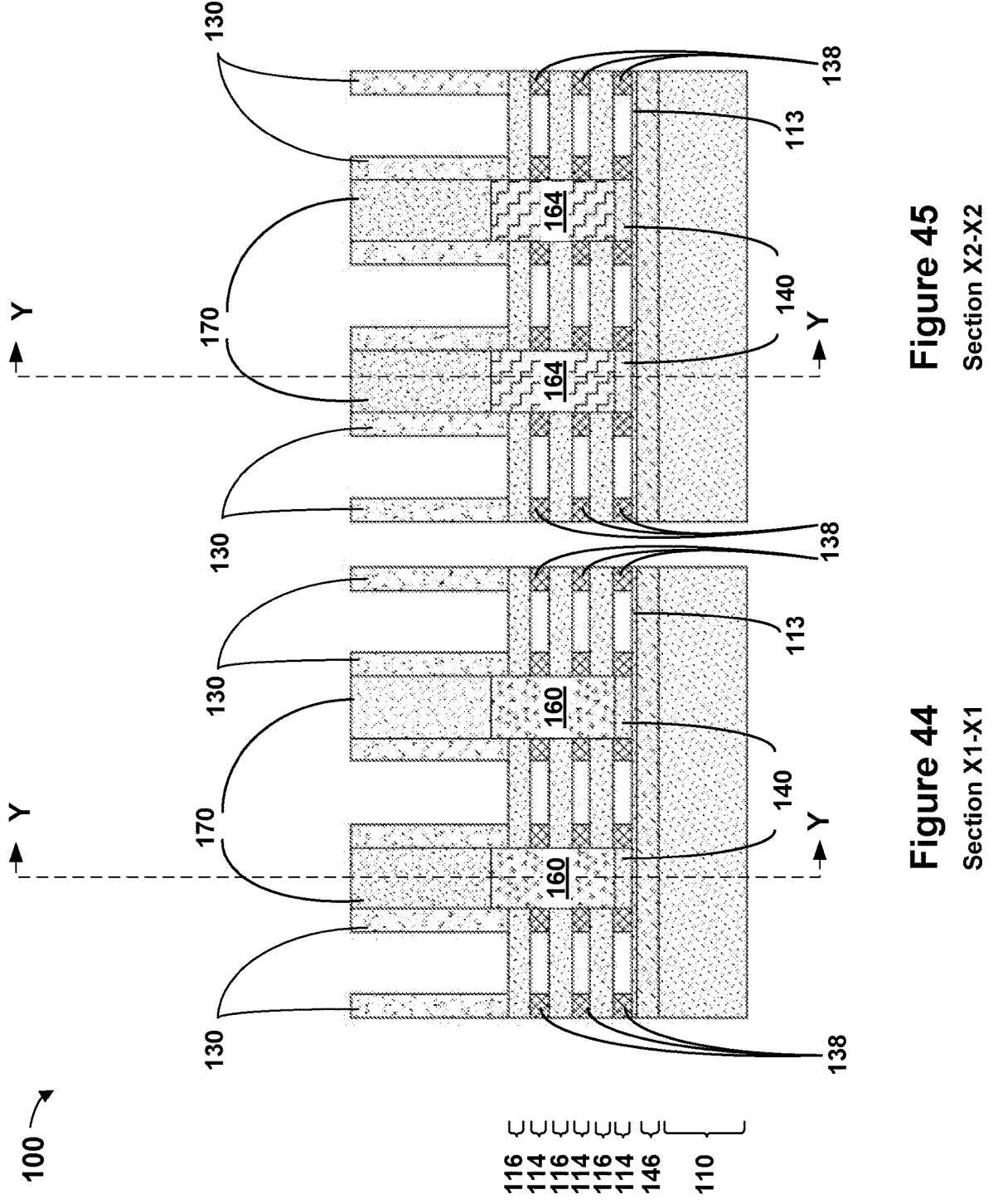
FIGS. 44, 45 and 46 each illustrate a cross-sectional view of the of the semiconductor structure along section lines X1-X1, X2-X2 and Y-Y, respectively, and illustrates formation of an interlayer dielectric, and removal of gate hard mask, sacrificial gate and sacrificial suspension layers, according to an exemplary embodiment.
Figure 46:
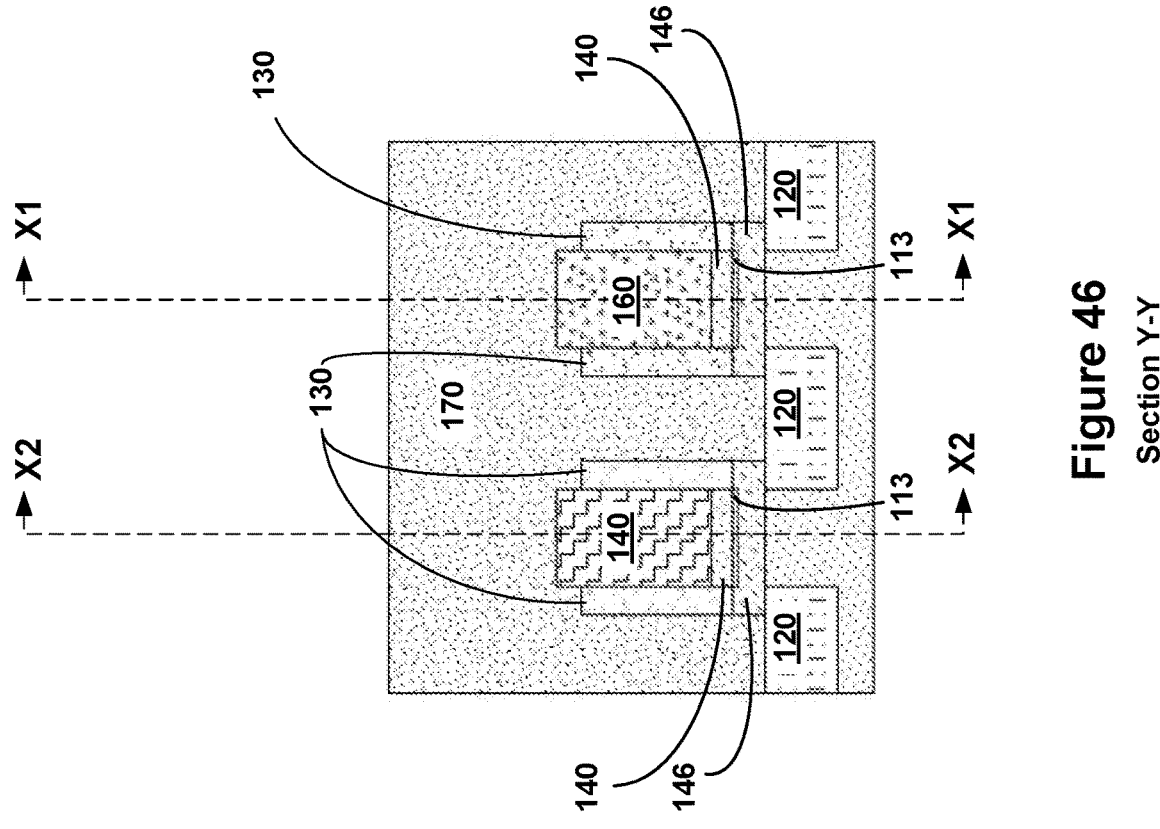

Referring now to FIGS. 44, 45 and 46, the structure 100 is shown according to an exemplary embodiment. FIGS. 44 and 45 are each a cross-sectional view of the structure 100 along section lines X1-X1 and X2-X2, respectively, and are parallel to each other. FIG. 46 is a cross-sectional view of the structure 100 along section line Y-Y and is perpendicular to section lines X1-X1 and X2-X2. An interlayer dielectric ("ILD") 170 may be formed. The gate hard mask 124 and the sacrificial gate 122 may be removed. The sacrificial suspension layers 114 may be removed.

The ILD 170 may be formed after several processes, including for example, conformally depositing or growing a dielectric and performing an anisotropic etch process. The ILD 170 may include any dielectric material such as silicon nitride and may include a single layer or may include multiple layers of dielectric material. The ILD 170 may be formed between spacers 130 which are each on adjacent sacrificial gates 122. The ILD 170 may be formed on the p-FET source drain epitaxy 160 and the n-FET source drain epitaxy 164. The ILD 170 may cover an upper surface of the spacer 130. The ILD 170 may have a vertical side surface of the spacer 130 and the bottom dielectric isolation 146. The ILD 170 may be formed on the exposed portions of the STI 120.

The structure 100 may be subject to a chemical mechanical polishing (CMP) technique to remove excess material, including the ILD 170 and the gate hard mask 124, and polish upper surfaces of the structure 100.

The sacrificial gate 122, the gate hard mask 124 and the sacrificial suspension layers 114 may be removed by methods known in the art, and may be removed in one or more steps, selectively, or may be removed at the same time. For example, a dry etch process can be used, such as using vapor phased HCl dry etch. In an embodiment, an ammonia based etch, NH$_3$, may be used for removal of the sacrificial gate 122, a hydrogen fluoride based etch such as HF may be used to remove the gate hard mask 124, and a hydrogen chloride, HCl, based etch may be used to remove the sacrificial suspension layers 114. The sacrificial gate 122, gate hard mask 124 and the sacrificial suspension layers 114 may be removed selective to the spacers 130, the inner spacers 138, the channel layers 116, the bottom dielectric isolation 146, the p-FET source drain epitaxy 160, the n-FET source drain epitaxy 164, the ILD 170 and the undoped silicon epitaxy 140.

Figures 47, 48:
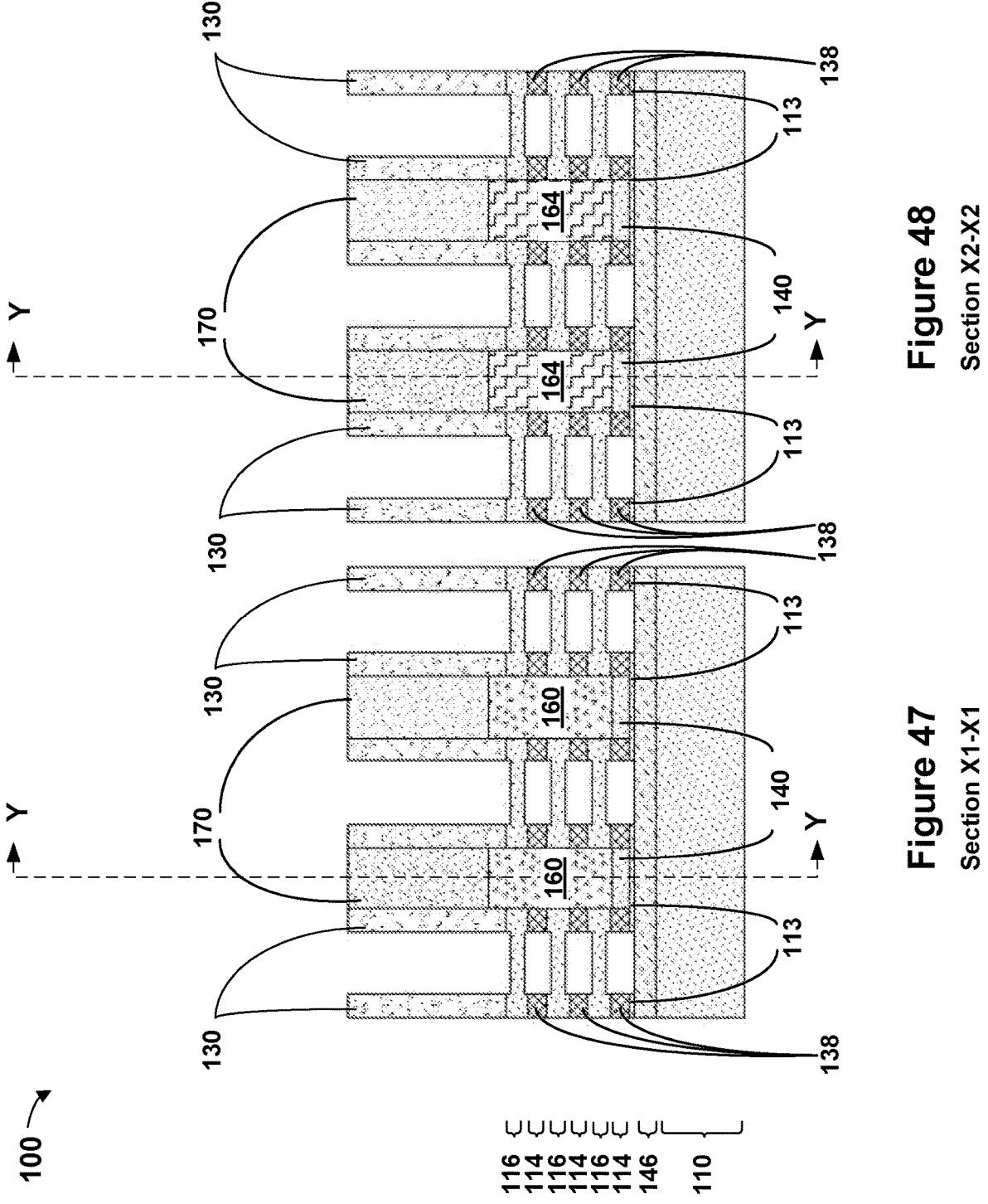
FIGS. 47, 48 and 49 each illustrate a cross-sectional view of the of the semiconductor structure along section lines X1-X1, X2-X2 and Y-Y, respectively, and illustrates selective etching, according to an exemplary embodiment.
Figure 49:
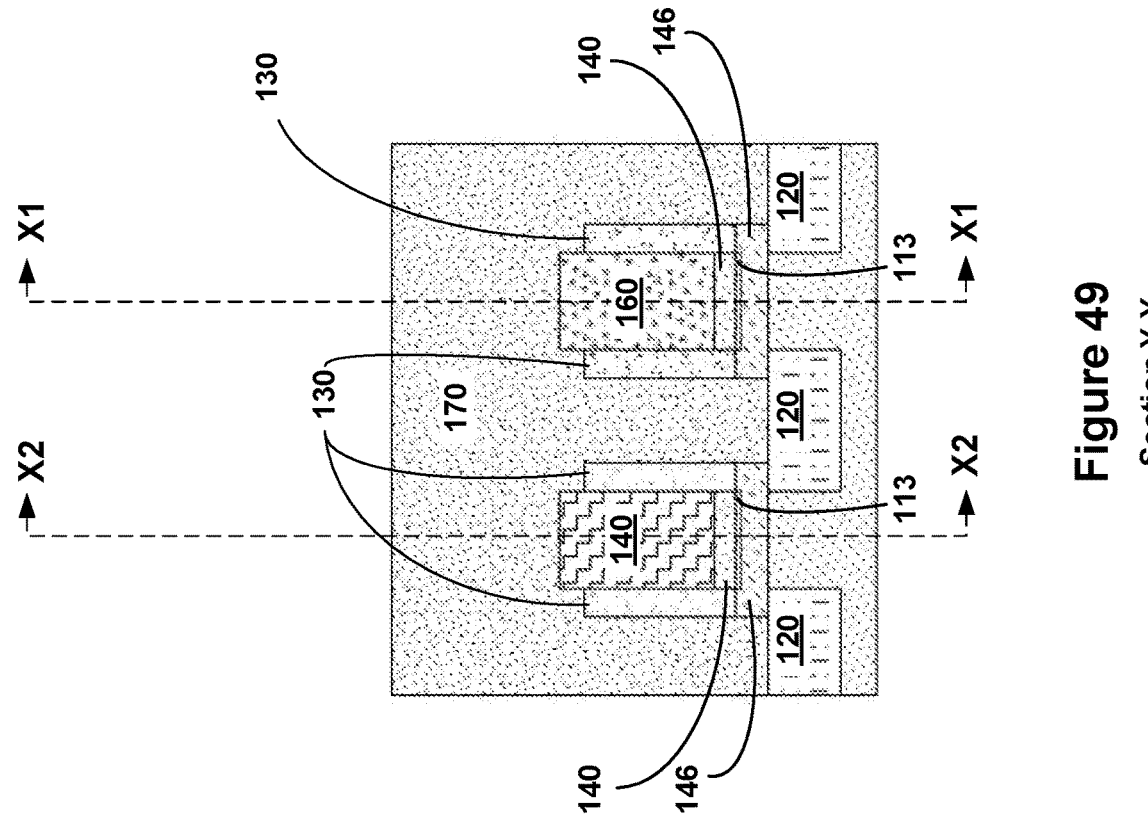
Figure 49:
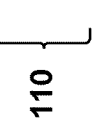

Referring now to FIGS. 47, 48 and 49, the structure 100 is shown according to an exemplary embodiment. FIGS. 47 and 48 are each a cross-sectional view of the structure 100 along section lines X1-X1 and X2-X2, respectively, and are parallel to each other. FIG. 49 is a cross-sectional view of the structure 100 along section line Y-Y and is perpendicular to section lines X1-X1 and X2-X2. A selective isotropic etch of the channel layers 116 may be performed and portions of the seed layer 113 may be removed.

A controlled oxidation of exposed portions of the channel layers 116 and of the seed layer 113 may be done by a wet or dry oxidation process providing sub-nanometer level of control, in areas below where the sacrificial gate 122 and gate hard mask 124 were removed. Exposed portions of the inner spacers 138, the channel layers 116 may not be affected by the controlled oxidation.

A selective isotropic etch of the exposed portions of the channel layers 116 may be done, resulting in a thinning of the oxidized portions of the channel layers 116 by 1 nanometer or less. This selective isotropic etch may result in a removal of the exposed portions of the seed layer 113. The seed layer 113 may remain below the inner spacers 138 and below the undoped epitaxy 140, and above the bottom dielectric isolation 146.

Figures 50, 51:
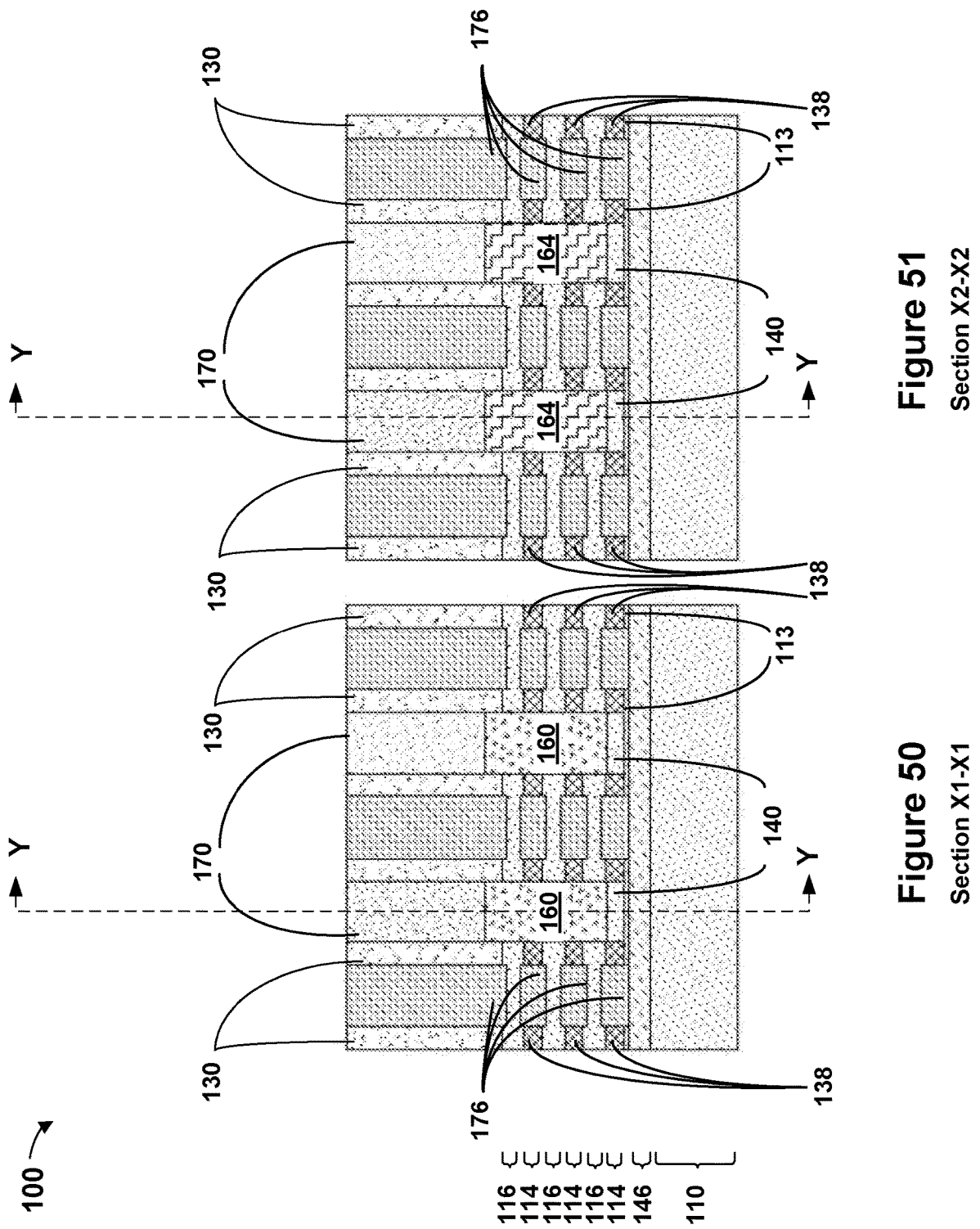
FIGS. 50, 51 and 52 each illustrate a cross-sectional view of the of the semiconductor structure along section lines X1-X1, X2-X2 and Y-Y, respectively, and illustrates formation of a gate stack, according to an exemplary embodiment.
Figure 52:
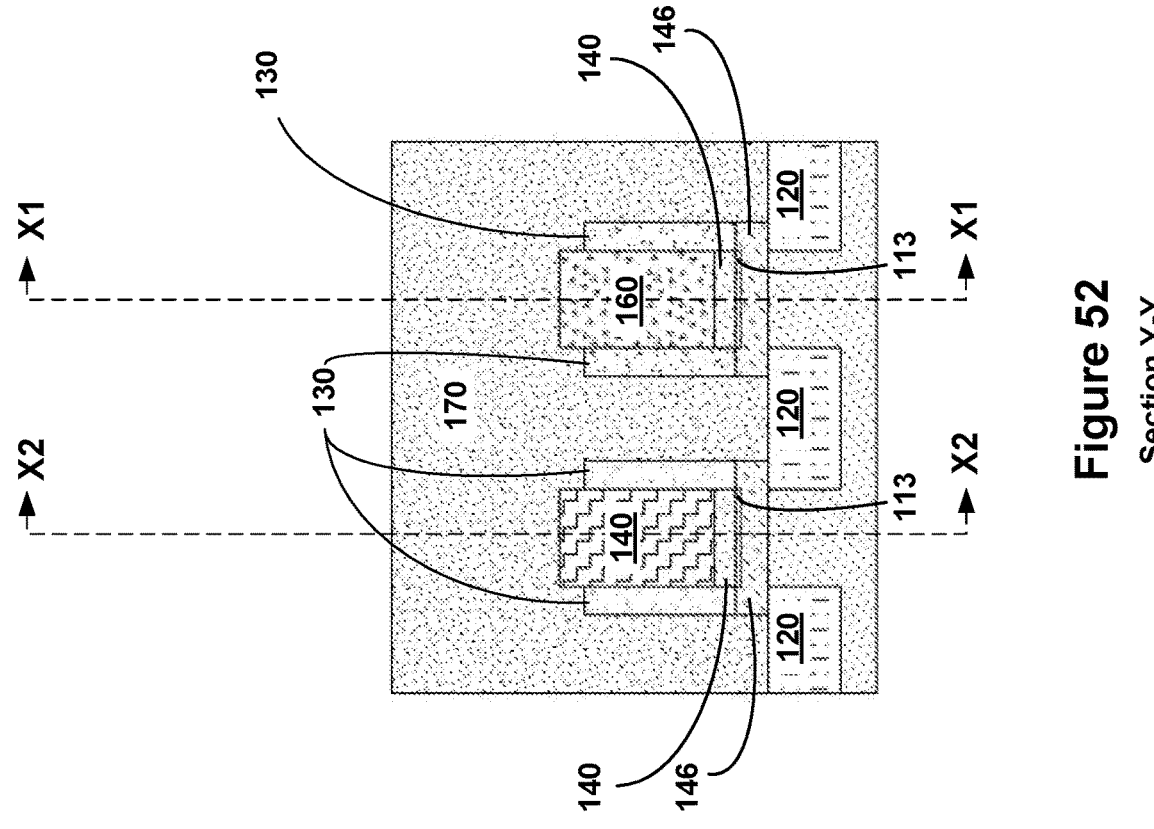

Referring now to FIGS. 50, 51 and 52, the structure 100 is shown according to an exemplary embodiment. FIGS. 50 and 51 are each a cross-sectional view of the structure 100 along section lines X1-X1 and X2-X2, respectively, and are parallel to each other. FIG. 52 is a cross-sectional view of the structure 100 along section line Y-Y and is perpendicular to section lines X1-X1 and X2-X2. A gate stack 176 may be formed.

The gate stack 176 may be formed in openings where the gate hard mask 124, the sacrificial gate 122 and the sacrificial suspension layers 114 were removed, and where the exposed portion of the seed layer 113 was removed.

The gate stack 176 may be conformally formed on the structure 100, according to an exemplary embodiment. The gate stack 176 is formed in each cavity of the nanosheet stack and surrounding suspended portions of the channel layers 116. The gate stack 176 may be wrapped around each channel layer 116.

The gate stack 176 forms a layer surrounding exposed portions of the nanosheet stacks. The gate stack 176 may cover an exposed portion of the STI 120, between exposed portions of the bottom dielectric isolation 146 and a lowermost channel layer 116, exposed surfaces between the inner spacers 138, exposed portions surrounding the channel layers 116 and exposed surfaces between the spacers 130 over the nanosheet stack. The gate stack 176 may fill a remainder of openings where the sacrificial suspension layers 114 were removed and the portions of the seed layer 113 was removed. The gate stack 176 may fill an opening where the sacrificial gate 122 was removed between spacers 130 over the nanosheet stack.

In an embodiment, a high-k liner, not shown, may be conformally formed before formation of the gate stack 176, and the gate stack 176 formed on the high-k liner. The high-k liner, not shown, may cover an exposed portion of the STI 120, surround exposed portions of the bottom dielectric isolation 146, exposed surfaces between the inner spacers 138 and exposed surfaces between the spacers 130 over the nanosheet stack. The high-k liner, not shown, may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the high-k liner, not shown, may include one or more layers. The high-k liner, not shown, may include materials such as HfO2, ZrO2, Al2O3, La2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. The high-k liner, not shown, may be referred to as a gate dielectric, and may be 2 nm thick. The high-k liner, not shown, may serve as the gate oxide for future gate formation.

The gate stack 176 may be deposited using typical deposition techniques, for example, atomic layer deposition (ALD), molecular layer deposition (MLD), and chemical vapor deposition (CVD). The material chosen for the gate stack 176, and the high-k liner, not shown, may be selected based on a desired threshold voltage, in combination with other materials and properties as described above, for the nanosheet stack, where the gate stack 176 surrounds the channel layers 116, and whether the device is a p-FET or n-FET. In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the gate stack 176 may include one or more layers to achieve desired device characteristics.

After forming the gate stack 176, a chemical mechanical polishing (CMP) technique may be used to remove excess material and polish upper surfaces of the structure 100 such that upper horizontal surfaces of the gate stack 176, the spacers 130 and the ILD 170 are coplanar.

The resulting structure has a benefit of the p-FET source drain epitaxy 160 and the n-FET source drain epitaxy 164 growing with strain from both the undoped silicon epitaxy 140 and the channel layers 116 of the nanosheet stack.

In a fully integrated device, a dielectric may cover the structure 100, and contacts may be made to each gate and to each of the p-FET source drain epitaxys 160, and the n-FET source drain epitaxys 164.

Figures 53, 54:
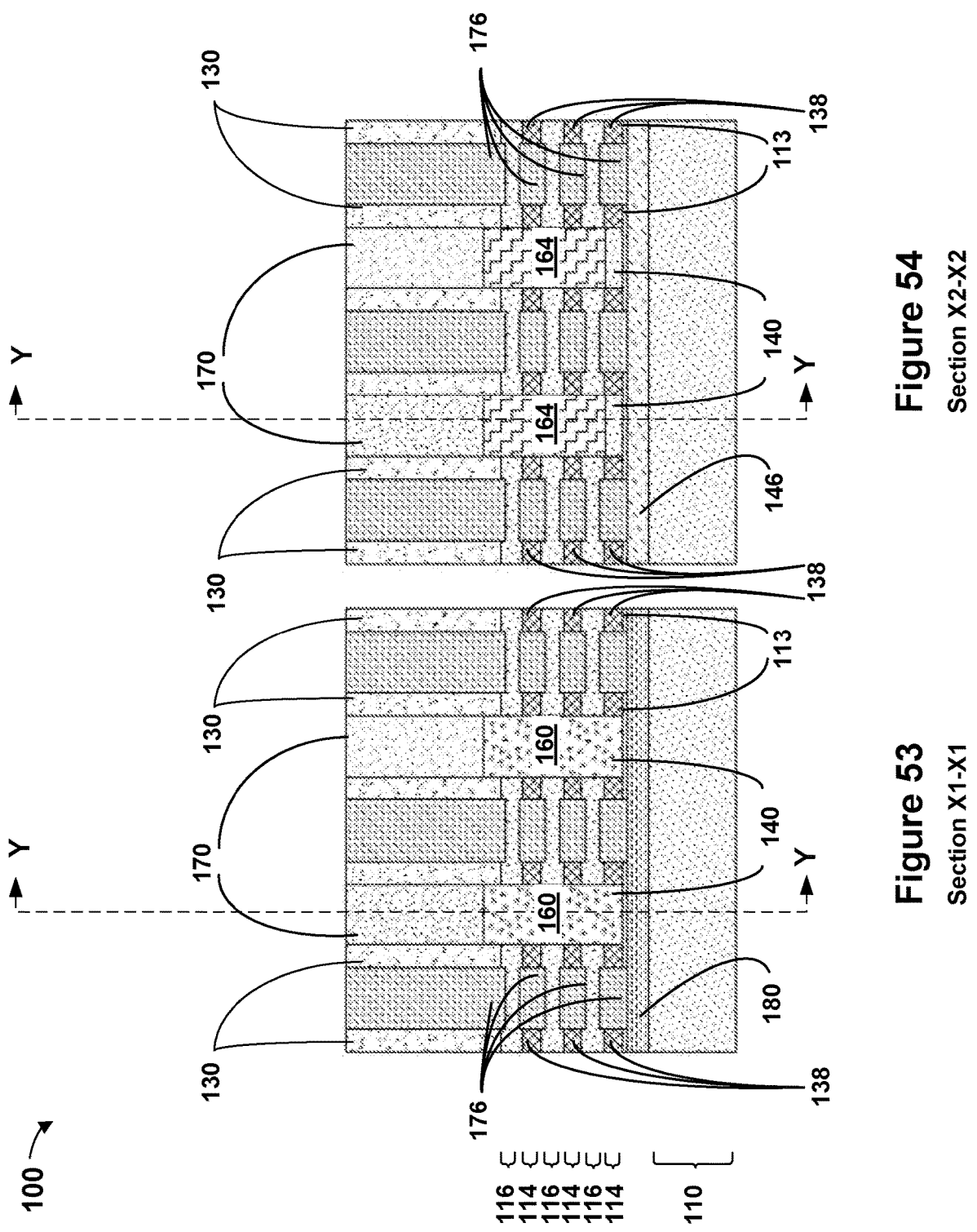
FIGS. 53, 54 and 55 each illustrate a cross-sectional view of the of the semiconductor structure along section lines X1-X1, X2-X2 and Y-Y, respectively, and illustrates an alternate embodiment.
Figure 55:
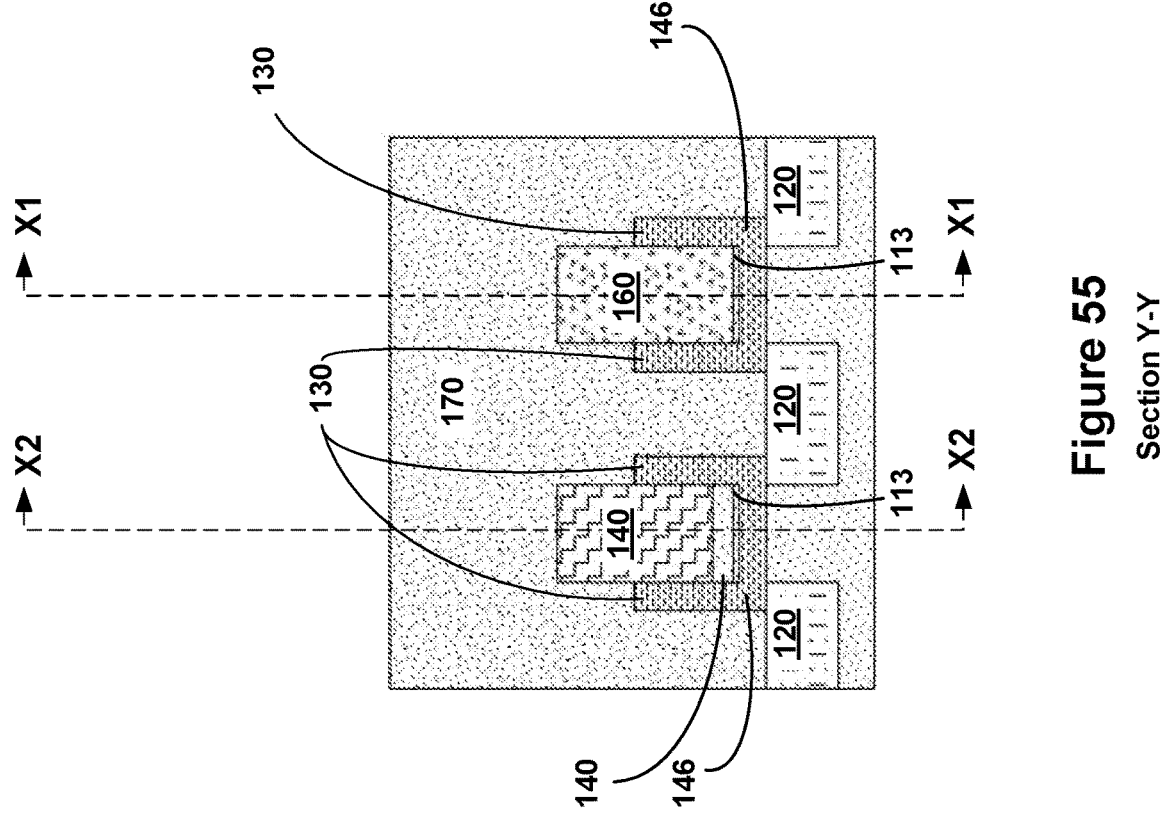

Referring now to FIGS. 53, 54 and 55, the structure 100 is shown according to an alternate embodiment. FIGS. 53 and 54 are each a cross-sectional view of the structure 100 along section lines X1-X1 and X2-X2, respectively, and are parallel to each other. FIG. 55 is a cross-sectional view of the structure 100 along section line Y-Y and is perpendicular to section lines X1-X1 and X2-X2.

In comparison of FIGS. 53, 54 and 55 to FIGS. 50, 51 and 52, along section line X1-X1, the bottom dielectric isolation 146 is replaced by a second bottom dielectric isolation 180. The bottom dielectric isolation 146 remains along section line X2-X2. Additionally, along section line X1-X1, the p-FET source drain epitaxy 160 has a lower horizontal surface along an upper surface of the second bottom dielectric isolation 180, rather than having the undoped silicon epitaxy 140 between the p-FET source drain epitaxy 160 and the bottom dielectric isolation 146.

Changes in the process described above include during the steps described in FIGS. 26, 27 and 28, rather than forming the bottom dielectric isolation 146 uniformly in the gap 144, sections line X1-X1 and X2-X2 would be separately processed, with the bottom dielectric isolation 146 formed along section line X2-X2, and the second bottom dielectric isolation 180 formed along section line X1-X1. Furthermore, for the steps described in FIGS. 35, 36, 37, rather than removing a portion of the undoped silicon epitaxy 140 between adjacent sacrificial gates 122, the updoped silicon epitaxy 140 may be completely removed, exposing an upper surface of what is now the second bottom dielectric isolation 180.

In this embodiment, the second bottom dielectric 180 may be formed of the same material as the spacer 130.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor gate-all-around device comprising:
semiconductor channel layers vertically aligned and stacked one on top of another, the semiconductor channel layers separated from each other by a gate stack material wrapping around the semiconductor channel layers; and
a heavily doped p-type field effect transistor (p-FET) source drain epitaxy region adjacent to the semiconductor channel layers, wherein a horizontal lower surface of the p-FET source drain epitaxy region is adjacent to a horizontal upper surface of an undoped silicon epitaxy, and wherein the p-FET source drain epitaxy is a same width as the undoped silicon epitaxy.

2. The semiconductor gate-all-around device according to claim 1, further comprising:
a bottom isolation region aligned below the undoped silicon epitaxy and below the semiconductor channel layers, wherein a topmost surface of the bottom isolation is below the undoped silicon epitaxy.

3. The semiconductor gate-all-around device according to claim 1, further comprising:
a heavily doped n-type field effect transistor (n-FET) source drain epitaxy doped region adjacent to a second set of semiconductor channel layers, wherein a horizontal lower surface of the n-FET source drain epitaxy region is adjacent to the horizontal upper surface of the undoped silicon epitaxy.

4. The semiconductor gate-all-around device according to claim 1, wherein
an upper horizontal surface of the undoped silicon epitaxy is below a lower horizontal surface of a lowermost channel layer of the semiconductor channel layers.

5. The semiconductor gate-all-around device according to claim 1, further comprising:
an inner spacer surrounding the gate stack material, the gate stack material wrapping around the semiconductor channel layers, and adjacent to the heavily doped source drain epitaxy region.

6. The semiconductor gate-all-around device according to claim 1, wherein
each of the semiconductor channel layers comprise an edge having a first height and an interior having a second height, and wherein the first height is greater than the second height.

7. A semiconductor device comprising:
a first set of semiconductor channel layers vertically aligned and stacked one on top of another;
a heavily doped p-type field effect transistor (p-FET) source drain epitaxy region adjacent to the first set of semiconductor channel layers, wherein a horizontal lower surface of the p-FET source drain epitaxy region is adjacent to a horizontal upper surface of an undoped silicon epitaxy;
a heavily doped n-type field effect transistor (n-FET) source drain epitaxy doped region adjacent to a second set of semiconductor channel layers, wherein a horizontal lower surface of the n-FET source drain epitaxy region is adjacent to the horizontal upper surface of the undoped silicon epitaxy;
a bottom isolation region aligned below the undoped silicon epitaxy and below the semiconductor channel layers; and
a seed layer separating the bottom isolation and undoped silicon epitaxy.

8. The semiconductor device according to claim 7, further comprising a gate stack material wrapping around the first set of semiconductor channel layers, and wherein the undoped silicon epitaxy is horizontally separated from the gate stack material by an inner spacer.

9. The semiconductor device according to claim 7, wherein
an upper horizontal surface of the undoped silicon epitaxy is below a lower horizontal surface of a lowest channel layer of the semiconductor channel layers.

10. The semiconductor device according to claim 8, wherein
the inner spacer surrounding gate stack material, the gate stack material wrapping around the semiconductor channel layers, and adjacent to the heavily doped p-FET source drain epitaxy region.

11. The semiconductor device according to claim 10, wherein
each of the semiconductor channel layers comprise an edge having a first height and an interior having a second height, and wherein the first height is greater than the second height.

12. The semiconductor device according to claim 7, wherein
a lower surface of a conductive trench contact is adjacent to an upper surface of a portion of the source drain epitaxy region.

13. A method comprising:
forming a first stack of nanosheet layers on a substrate, a second stack of nanosheet layers on the substrate, and a third stack of nanosheet layers on the substrate, the first stack, the second stack and the third stack of nanosheet layers each comprising alternating layers of a sacrificial and a semiconductor channel vertically aligned and stacked one on top of another;
forming a first sacrificial gate across the first stack of nanosheet layers, a second sacrificial gate across the second stack of nanosheet layers and a third sacrificial gate across the third stack of nanosheet layers; and
forming an undoped silicon epitaxy between the first stack and the second stack of nanosheet layers and between the second stack and the third stack of nanosheet layers.

14. The method according to claim 13, further comprising:
after forming the undoped silicon epitaxy between the first stack and the second stack of nanosheet layers and between the second stack and the third stack of nanosheet layers,
replacing a sacrificial epitaxial layer under the first stack, second stack and third stack of nanosheet layers and under the undoped silicon epitaxy, with a continuous bottom dielectric isolation.

15. The method according to claim 14, further comprising:

replacing a portion of the undoped silicon epitaxy between the first stack and the second stack of nanosheet layers with a heavily p-type field effect transistor (p-FET) source drain epitaxy region; and replacing a portion of the undoped silicon epitaxy between the second stack and the third stack of nanosheet layers with a heavily n-type field effect transistor (n-FET) source drain epitaxy region.

16. The method according to claim 13, further comprising:

replacing the first, second and third sacrificial gate with a first, second and third gate stack.

17. The method according to claim 13, further comprising:

after forming the undoped silicon epitaxy between the first stack and the second stack of nanosheet layers and between the second stack and the third stack of nanosheet layers, replacing a sacrificial epitaxial layer under the first stack and second stack of nanosheet layers and under the undoped silicon epitaxy between the first stack and the second stack of nanosheet layers with a first continuous bottom dielectric isolation; and replacing a sacrificial epitaxial layer under the third stack of nanosheet layers and under the undoped silicon epitaxy between the second stack and the third stack of nanosheet layers with a second continuous bottom dielectric isolation.

18. The method according to claim 17, further comprising:

replacing the undoped silicon epitaxy between the first stack and the second stack of nanosheet layers with a heavily p-type field effect transistor (p-FET) source drain epitaxy region; and replacing a portion of the undoped silicon epitaxy between the second stack and the third stack of nanosheet layers with a heavily n-type field effect transistor (n-FET) source drain epitaxy region.

19. The method according to claim 13, wherein an upper horizontal surface of the undoped silicon epitaxy is below a lower horizontal surface of a lowest channel layer of the first stack of nanosheet layers.

20. The method according to claim 13, wherein an inner spacer surrounding gate stack material, the gate stack material wrapping around the semiconductor channel layers of the first stack of nanosheet layers, and adjacent to the heavily doped p-FET source drain epitaxy region.

\* \* \* \* \*